US011999613B2

(12) United States Patent
Mollard et al.

(10) Patent No.: US 11,999,613 B2
(45) Date of Patent: Jun. 4, 2024

(54) ELECTROMECHANICAL MICROSYSTEM

(71) Applicant: COMMISSARIAT A L'ENERGIE ATOMIQUE ET AUX ENERGIES ALTERNATIVES, Paris (FR)

(72) Inventors: Laurent Mollard, Grenoble (FR); Stéphane Nicolas, Grenoble (FR); Damien Saint-Patrice, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 100 days.

(21) Appl. No.: 17/828,091

(22) Filed: May 31, 2022

(65) Prior Publication Data
US 2022/0380205 A1 Dec. 1, 2022

(30) Foreign Application Priority Data

May 31, 2021 (FR) ..................... 21 05643

(51) Int. Cl.
*B81B 3/00* (2006.01)
*B81C 1/00* (2006.01)
(52) U.S. Cl.
CPC ........ *B81C 1/00158* (2013.01); *B81B 3/0021* (2013.01); *B81B 2203/0127* (2013.01); *H04R 2201/003* (2013.01)
(58) Field of Classification Search
CPC .............. B81C 1/00158; B81B 3/0021; B81B 2203/0127; B81B 2203/0181;
(Continued)

(56) References Cited

U.S. PATENT DOCUMENTS 6,811,133 B2 11/2004 Miles
10,302,897 B2 5/2019 Bolis
(Continued)

FOREIGN PATENT DOCUMENTS

CN 102818069 A 12/2012
CN 103016434 A 4/2013
(Continued)

OTHER PUBLICATIONS

French Preliminary Search Report dated Feb. 25, 2022 in French Application 21 05643 filed on May 31, 2021, 9 pages (with English Translation of Categories of Cited Documents & Written Opinion).

*Primary Examiner* — Brian Ensey
(74) *Attorney, Agent, or Firm* — Oblon, McClelland, Maier & Neustadt, L.L.P.

(57) ABSTRACT

An electromechanical microsystem including an electromechanical transducer, a deformable diaphragm and a cavity hermetically containing a deformable medium keeping a constant volume under the action of an external pressure change. The deformable diaphragm forms a wall of the cavity and has at least one free area so as to be elastically deformed. The electromechanical transducer is configured so that its movement depends on the change in the external pressure, and vice versa. The free area cooperates with an external member so that its deformation induces, or is induced by, a movement of the external member. Thus, the electromechanical microsystem is adapted to displace the external member or to detect a movement of this member, the electromechanical microsystem includes at least one pin, configured to bear on a peripheral portion of the free area so that a deformation of the free rea causes an inclination of the pin.

22 Claims, 23 Drawing Sheets

(58) Field of Classification Search
CPC .......... B81B 3/0027; B81B 2201/0264; H04R 2201/003; H04R 201/0264
See application file for complete search history.

(56) References Cited

U.S. PATENT DOCUMENTS

| | | |
|---|---|---|
| 10,371,871 B2 | 8/2019 | Bolis |
| 11,326,969 B2 * | 5/2022 | Zehringer ............. G01L 9/0073 |
| 11,750,973 B2 * | 9/2023 | Patel ........................ H04R 3/02 |
| | | 381/96 |
| 2012/0006783 A1 | 1/2012 | Pouydebasque et al. |
| 2012/0069450 A1 | 3/2012 | Bolis |
| 2017/0017019 A1 | 1/2017 | Bolis |
| 2017/0108626 A1 | 4/2017 | Bolis |

FOREIGN PATENT DOCUMENTS

| | | |
|---|---|---|
| CN | 102878139 B | 5/2014 |
| CN | 107807255 B | 2/2020 |
| DE | 198 44 518 A1 | 4/2000 |
| DE | 10 2017 200 057 A1 | 7/2018 |
| EP | 3 120 171 B1 | 9/2019 |
| EP | 3 123 212 B1 | 6/2020 |
| EP | 3 304 138 B1 | 9/2020 |
| EP | 3 227 739 B1 | 8/2021 |
| WO | WO 2015/091834 A1 | 6/2015 |
| WO | WO 2015/091836 A1 | 6/2015 |

\* cited by examiner

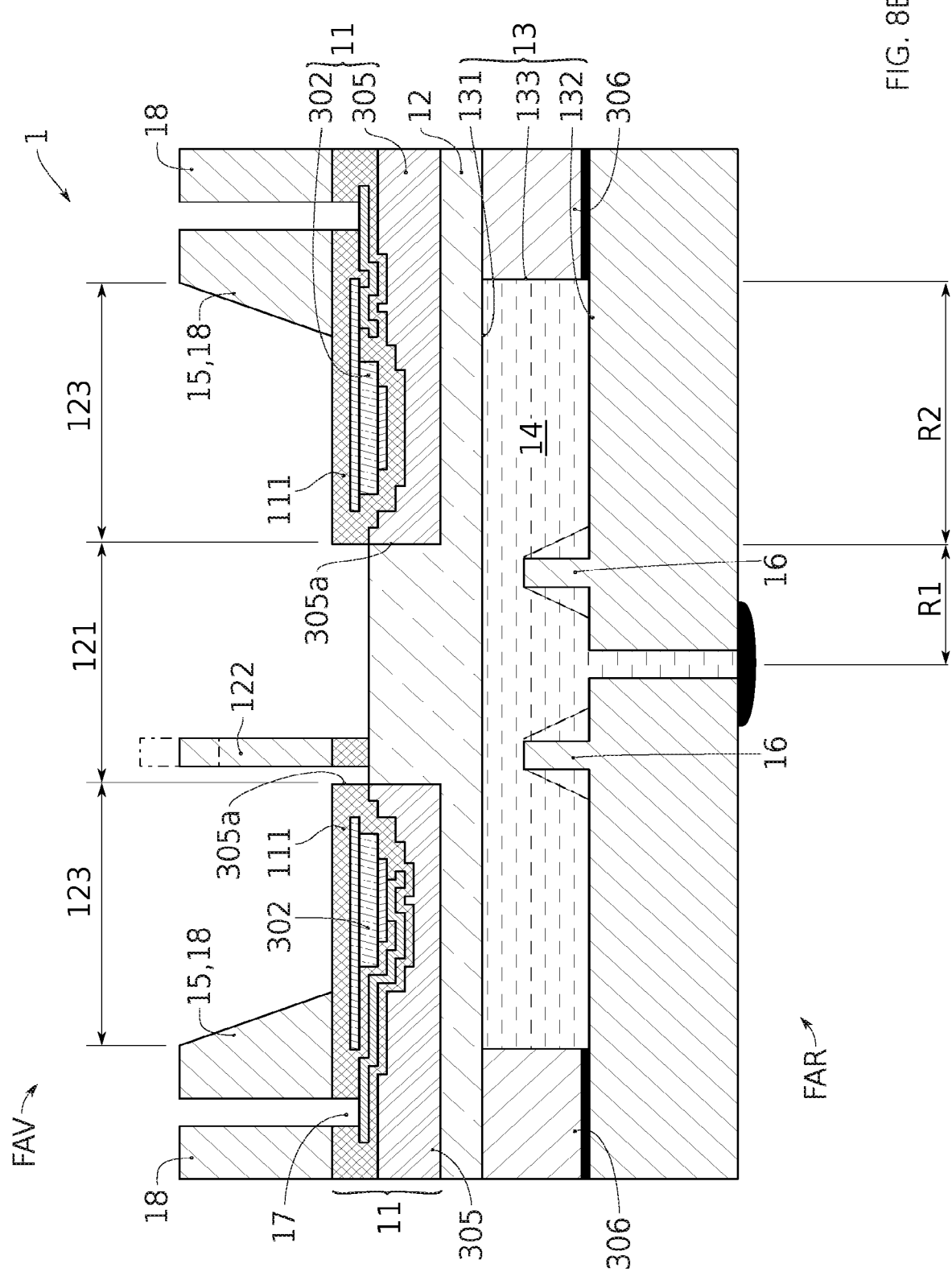

ELECTROMECHANICAL MICROSYSTEM

TECHNICAL FIELD

The present invention relates to the fields of electromechanical microsystems. For example, it finds a particularly advantageous application in the actuation or the displacement of objects, including over relatively large distances. It also finds application in gripping devices that allow capturing or expelling small-sized objects. The invention also finds application in the field of contact detection. Thus, it could be implemented to make sensors.

PRIOR ART

In many applications, it might be needed to displace, capture or expel microscopic, and possibly nanoscopic, objects, and/or needed to detect the movements of such objects. There are microsystems that allow this.

In the case where these microsystems are actuators or gripping devices, their performances are assessed in particular on the following parameters: the amplitude of the movement, the exerted force, the accuracy of the generated movement or else the accuracy of the detection or the expulsion of an object. In the case where these microsystems are sensors, their performances are assessed in particular on the following parameters: the capability to detect a movement over a significant amplitude and the accuracy of the measurement.

Otherwise, whether the microsystems consist of actuators, gripping devices or sensors, what is aimed is that they offer good performances in terms of bulk, energy consumption and capability to work in frequency.

All known solutions have low performances for at least one of these parameters. In general, the existing microsystems have performances that are too unsatisfactory for a combination of these parameters.

An object of the present invention is to provide an electromechanical microsystem which has improved performances in comparison with the existing solutions, at least for one of the above-mentioned parameters, or which has a better trade-off between at least two of the aforementioned parameters.

The other objects, features and advantages of the present invention will appear upon examining the following description and the appended drawings. It goes without saying that other advantages could be incorporated.

SUMMARY

To achieve this objective, according to one embodiment, an electromechanical microsystem is provided comprising:
  at least one electromechanical transducer comprising a portion movable between a balance position, off-load, and an out-of-balance position, under load,
  at least one deformable diaphragm,
  a first deformable cavity, delimited by walls, at least one portion of the deformable diaphragm forming at least one portion of a first wall selected amongst said walls of the cavity, the cavity being configured to hermetically contain a deformable medium capable of keeping a substantially constant volume under the action of a change of an external pressure exerted on the deformable medium through one of the walls of the cavity.

The movable portion of the electromechanical transducer is configured so that its movement depends on said change in the external pressure, or conversely its movement induces a change in the external pressure. Said at least one portion of the deformable diaphragm has at least one area freely deformable, preferably elastically, as a function of said change in the external pressure.

The free area has an outer perimeter and a peripheral portion which extends from the outer perimeter and up to a central portion of the free area.

Typically, the suggested electromechanical microsystem allows obtaining an inclination of the pin according to an angle having a large amplitude in comparison with the deformation of the diaphragm. It is then possible to obtain large strokes, even with an electromechanical microsystem with small dimensions. In particular, the second end of the pin, i.e. the end of the pin opposite to its end bearing on the diaphragm, is displaced over a large travel range.

Typically, the displacement of the second end of the pin may be performed over a travel length that could be expressed in an angular form. Typically, the second end of the pin is displaced by an angle of at least 45°, and preferably comprised between 0° and 90°.

Hence, the provided electromechanical microsystem presents a particularly effective solution to make:
  an actuator with a large stroke. Such an actuator enables the displacement of an object or of an external member displaced by the pin(s), typically with an amplitude in the range of 100 μm.
  a gripping device. By providing for several pins over the free area of the diaphragm, in particular over its peripheral portion, it is possible to make the ends of the different pins approach each other so as to allow grasping, capturing or holding an object between the pins. Conversely, it is possible to control the detachment of the pins so as to allow releasing or expelling an object. Similarly, by providing for at least one pin whose free end is shaped so as to cooperate with an object to grasp it, the displacement of the pin allows capturing or releasing an object. It is also possible to provide for the material of the pin enabling the capture of an object, by adhesive forces or magnetic forces.
  a sensor, typically allowing detecting a displacement imposed on at least one pin. This displacement may be a displacement according to a curved trajectory.

Thus, the electromechanical microsystem as introduced hereinabove is able to to displace the pin or to detect a movement imposed on the latter, and that being so while featuring, in a way that could be easily modulated depending on the targeted applications, a sufficient capability in terms of displacement amplitude and/or a sufficient capability in terms of deployed force and/or a capability to detect movement, and possibly capture, an object and/or a sufficient capability to work in frequency and/or a size compatible with the targeted applications, and/or a reduced energy consumption.

Another aspect of the invention relates to an opto-electromechanical system or microsystem comprising at least one electromechanical microsystem as introduced hereinabove and at least one optical microsystem.

Preferably, the optical microsystem comprises at least one mirror, preferably based on silicon. The opto-electro-mechanical system is configured so that the movement of the movable portion of the electromechanical transducer cause a displacement, preferably an inclination, of the at least one mirror.

Another aspect of the invention relates to a method for manufacturing an electromechanical microsystem as introduced hereinabove, comprising, and possibly being limited to, deposition and etching steps, quite common in the microelectronics industry. Indeed, the electromechanical microsystem may be manufactured by common means of the microelectronics industry, which confers on its manufacturer all of the advantages resulting from the use of these means, including a great flexibility in terms of sizing, energy of adhesion between the different deposits, thickness of the different deposits, extent of etching, etc.

According to one example, the method for manufacturing the electromechanical microsystem comprises the following steps:
- a step of forming, over a substrate, at least one portion of the electromechanical transducer, then
- a step of depositing the deformable diaphragm, then
- a step of forming an open cavity over the deformable diaphragm, then
- a step of filling with the deformable medium and closing the cavity, and
- a step of etching the substrate to form a front face (FAV) of the electromechanical microsystem.

BRIEF DESCRIPTION OF THE FIGURES

The aims, objects, as well as the features and advantages of the invention will appear better from the detailed description of embodiments of the latter which are illustrated by the following appended drawings wherein:

In FIGS. 1 and 2, the electromechanical microsystem is illustrated in a configuration in which the diaphragm is not deformed.

In FIGS. 4 and 5, the electromechanical microsystem is illustrated in a configuration in which the diaphragm is not deformed.

FIGS. 6A and 6B illustrate a configuration in which the free ends of the pins are spread apart from each other, for example to capture an object.

FIGS. 6C to 6E illustrate a configuration in which the free ends of the pins are brought close to each other, for example to enable grasping of an object or to prevent the release of a captured object.

In FIG. 7A, the diaphragm is represented deformed according to a first configuration. In FIG. 7B, the diaphragm is represented deformed according to a second configuration.

FIGS. 8A and 8B are diagrams, more detailed than those of FIGS. 7A and 7B, and representing electromechanical microsystems structurally close to those illustrated in FIGS. 7A and 7B respectively.

FIGS. 9A to 15A schematically represent steps of an example of a method for making an electromechanical microsystem illustrated in FIG. 8A.

FIGS. 9B to 15B schematically represent steps of an example of a method for making an electromechanical microsystem illustrated in FIG. 8B.

Figure 1:
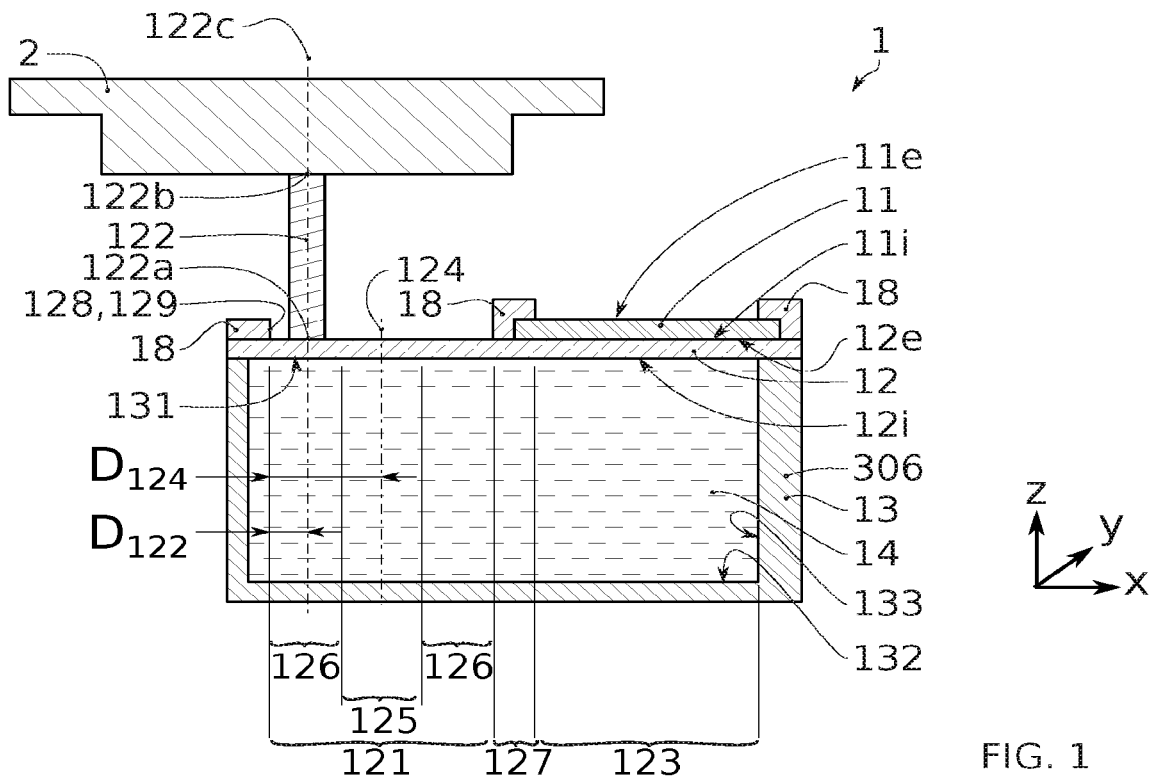
FIG. 1 is a block diagram of a sectional view of an electromechanical microsystem according to a first embodiment of the invention.

The drawings are provided as examples and do not limit the invention. They consist of schematic principle representations intended to facilitate understanding of the invention and are not necessarily to the scale of practical applications. In particular, the thicknesses of the different illustrated layers, walls and members do not necessarily represent reality.

DETAILED DESCRIPTION

According to one example, in the absence of deformation, the free area of the diaphragm primarily extends in a plane (xy), called off-deformation plane or rest plane, and the perpendicular to the tangent at a given point of the free area extends according to a direction T1 perpendicular to the off-deformation plane.

According to one example, when the diaphragm is deformed, the perpendicular to the tangent at a given point of the peripheral portion of the free area extends according to a direction T1, inclined with respect to the direction T1, by an angle αi (the angle αi being measured in a plane perpendicular to the off-deformation plane).

According to one example, the angle αi increases when getting away from the central portion and approaching the outer perimeter of the free area.

According to one example, the electromechanical microsystem is configured so that a deformation of the free area of the diaphragm causes an inclination of the pin in a plane perpendicular to a plane (xy) in which an outer face of the diaphragm primarily extends when the diaphragm is not deformed.

According to one example, the inclination may be measured by an angle α contained in a plane perpendicular to the plane xy.

According to one example, the pin primarily extends according to a longitudinal direction.

When the diaphragm is not deformed, the longitudinal direction of the pin is substantially perpendicular to a plane (xy) in which an outer face of the diaphragm primarily extends when the diaphragm is not deformed. The pin may have a cylindrical shape. According to an alternative embodiment, the pin does not have a cylindrical shape. For example, it may have a curved shape.

According to one example, the pin has a first end by which it bears on the peripheral portion of the free area and a second end opposite to the first end.

According to one example, the electromechanical microsystem is configured so that a deformation of the free area of the diaphragm causes an inclination of the first end in the direction of the central portion of the free area.

According to one example, the pin extends between the first end and the second end primarily according to a longitudinal direction. Alternatively, the pin has a curved shape or extends according to several different directions.

According to one example, the free area has a central portion extending from a centre of the free area and a peripheral portion disposed around the central portion.

According to one example, the peripheral area is continuous. It has a solid contour.

Alternatively, it has an open contour.

According to one example, the central portion comprises a centre of the free area, the centre corresponds for example to the barycentre of the free area.

According to one example, the free area forms a disk, an ellipse or a polygon and said centre corresponds to the barycentre of the free area.

According to one example, the free area is delimited by an outer perimeter, the pin being located at a minimum distance D122 from the outer perimeter, such that D122 is smaller than k times a distance D124, D122 being measured between the pin and the point of the outer perimeter the closest to the pin, and
the distance D124 being measured between this same point and the centre of the free area,
k being less than 0.7, preferably k being less than 0.5, preferably k being less than 0.3.

According to an alternative embodiment, the central portion does not form a disk, an ellipse or a polygon. The central portion may surround at least partially the electromechanical transducer. For example, the central portion may have an elongate shape. This elongate shape may extend according to several sections having different directions.

According to one example, the electromechanical microsystem comprises a plurality of pins, each bearing on the peripheral portion of the free area so that a deformation of the free area of the diaphragm causes an inclination of the pins.

According to one example, the pins have a free end, opposite to the end by which they bear on the peripheral portion of the free area, the pins being shaped so that a deformation of the free area of the diaphragm selectively causes an approach or a separation of their free ends.

According to one example, the pins are shaped so that a deformation of the free area of the diaphragm selectively causes a contact or a separation of the free ends of the pins.

According to one example, the pins are distributed over the peripheral portion so that the approach of their free ends allows grasping between the free ends and/or holding between the diaphragm and the pins an object that is external the electromechanical microsystem. The approach of their free ends allows forming a cage above the free area of the diaphragm.

This embodiment allows obtaining a particularly reliable and accurate gripping device. Furthermore, the large angular stroke of the pins, allows capturing and releasing objects with relatively large sizes in comparison with the size of the pins and with the size of the electromechanical microsystem.

In this embodiment, the object is not fastened to the electromechanical microsystem. All the more so, it is not fastened to the pins.

According to another embodiment, the object is an external member.

According to one example, the pin(s) is/are configured to cooperate with an object forming an external member so that the movement of the movable portion of the electromechanical transducer depends on a displacement of the pin(s) driven by the external member or conversely the movement of the movable portion of the electromechanical transducer induces a displacement, in particular an inclination, of the external member through the pin.

This embodiment allows obtaining a reliable and accurate actuator or a sensor. The large angular stroke of the pins enables a displacement of the external member over a relatively large travel in comparison with the size of the pin(s) and with the size of the electromechanical microsystem.

The pin(s) may be configured to cooperate with the external member through a guide secured to the external member, so as to enable an automatic positioning of the external member on the pin(s).

The pin(s) may be configured so as to be able to be secured to the external member by gluing or magnetically, the adhesive energy of the pin(s) on the free area of the deformable diaphragm being preferably higher than that of the pin(s) on the external member. An attachment, possibly removable, of the pin(s) and of the external member is thus provided for which is could be greatly modulated in terms of holding force.

According to one example, the electromechanical microsystem further comprises at least one lateral stop, preferably supported by said first wall of the cavity configured to guide the movement of the external member.

According to one example, the pin extends from the free area of the deformable diaphragm beyond said at least one lateral stop. According to an alternative example, the pin extends from the free area of the deformable diaphragm short within said lateral stop.

According to one example, the pin is fastened on said free area, preferably in direct contact with said free area.

According to one example, the electromechanical microsystem comprises a plurality of electromechanical transducers.

According to one embodiment, the electromechanical transducers are separated from each other. Their movable portions are not in contact. Alternatively, they are contiguous.

According to one example, an electromechanical transducer surrounds, at least partially, and possibly entirely, one or several other electromechanical actuator(s), in particular their movable portion. Furthermore, they may be actuated independently from each other.

Preferably, each electromechanical transducer has a movable portion configured so that its movement depends on said change in the external pressure, or conversely so that its movement induces a change in the external pressure exerted on the deformable medium through one of the walls of the cavity.

Thus, the electromechanical microsystem includes several electromechanical transducers for a cavity.

According to one example, at least some of the electromechanical transducers of said plurality are configured so that, under load, their movable portions induce deformations of the free area of the diaphragm causing an inclination of the at least one pin in the same direction.

Thus, at least some of these electromechanical transducers each allows displacing the at least one pin according to the same direction and each over one amplitude. The overall inclination of the pin results from the cumulated displacement of the movable portions of these electromechanical transducers. Thus, the electromechanical microsystem has a step-by-step operation; this allows limiting the addressing voltage.

The electromechanical transducers may be loaded simultaneously or successively. The amplitude of displacement of the pin induced by each electromechanical transducer may be identical or different.

According to one example, at least some of the electromechanical transducers of said plurality are configured so that, under load, their movable portions, induce deformations of the free area of the diaphragm in two opposite directions causing an inclination of the at least one pin in two opposite directions.

Thus, at least two of these electromechanical transducers allow displacing the at least one pin according to two opposite directions. Hence, these two electromechanical transducers are antagonist. Thus, at least one of these electromechanical transducers allows inclining the pin according to a first direction and at least another one of these electromechanical transducers allows inclining the pin according to a second direction opposite to the first direction. This allows increasing even more the amplitude of the inclination that is possible for the pin.

These two antagonist electromechanical transducers may be separated from each other by a non-zero distance. Alternatively, one of these electromechanical transducers may surround the other electromechanical transducer, preferably entirely. According to another embodiment, the same transducer allows performing these two alternating movements. For this purpose, it is possible to use a transducer made of AlN for example.

According to one example, the electromechanical microsystem comprises several free areas, separated from each other by a non-zero distance.

These free areas may be formed by the same diaphragm. Alternatively, these free areas may be formed by distinct diaphragms.

According to one example, the free area is freely deformable, preferably elastically, as a function of said change in the external pressure.

Preferably, the electromechanical microsystem as introduced hereinabove is devoid of any optical element, such as a lens, in particular a variable-focus one.

The pin is not fastened at the centre of the free area of the deformable diaphragm. In this manner, the movement of the pin is not a translational movement perpendicular to the wall of the cavity which is partially formed by the deformable diaphragm.

At least one portion of the electromechanical transducer forms a portion of the wall of the cavity which is partially formed by the deformable diaphragm. According to this feature, the electromechanical microsystem has a structure that is not open-through, leaving the other walls of the cavity free so as to be able implement other functions therein or so as to enable them to remain inert, for an increased integration capability in particular in an opto-electro-mechanical microsystem.

The electromechanical transducer may extend, directly or indirectly, over the deformable diaphragm, and preferably around the free area of the deformable diaphragm. Furthermore, the electromechanical transducer may have annular shape whose circular centre defines the extent of the free area of the deformable diaphragm.

The movable portion of the electromechanical transducer may have a surface at least twice as large, and possibly 5 times larger, and preferably at least ten times larger than the surface of the free area of the deformable diaphragm, and possibly than the surface of the free areas of the deformable diaphragm. The larger the surface of the transducer in comparison with the surface of the free area, the higher will be the amplitude of deformation of the free area of the diaphragm.

Preferably, the deformable diaphragm is configured so that its free area could be deformed with an amplitude of at least 50 µm, possibly of at least 100 µm, and possibly of at least 1,000 µm according to a direction perpendicular to the plane in which it primarily extends when it is at rest. Thus, without tearing and/or without any significant wear, the electromechanical microsystem offers the ability to address numerous and various application requiring a large stroke, the latter being defined where appropriate by the considered technical field.

According to one example, at least one portion of the electromechanical transducer forms a portion of said first wall of the cavity.

According to one example, the electromechanical transducer extends, directly over the deformable diaphragm, i.e. the electromechanical transducer is directly in contact with the deformable diaphragm. Alternatively, the electromechanical transducer extends indirectly over the deformable diaphragm, i.e. at least one element or one intermediate layer is disposed between the electromechanical transducer and the deformable diaphragm. Preferably, the electromechanical transducer extends around the free area of the deformable diaphragm.

According to one example, the electromechanical transducer completely surrounds the free area of the deformable diaphragm, the electromechanical transducer preferably having an annular shape whose circular centre defines the extent of the free area of the deformable diaphragm.

The electromechanical microsystem may further comprise at least one lateral stop configured to guide the movement of the pin or of the external member when present. According to an optional example, the lateral stop is supported by the wall of the cavity which is partially formed by the deformable diaphragm. According to an optional example, said at least one lateral stop extends opposite to the cavity.

Thus, it is possible to:
limit, in a controlled, reliable and reproducible manner, the inclination of the pin during the movement of the movable portion of the electromechanical transducer, and/or
enable a self-positioning of the external member with respect to the free area of the deformable diaphragm, and/or
protect the deformable diaphragm, and more particularly its free area, in particular from a possible pull-out, when affixing or gluing the external member.

According to one example, the free area of the deformable diaphragm is configured to cooperate with the external member via the pin fastened on said free area.

The pin may extend from the free area of the deformable diaphragm beyond said at least one lateral stop.

Alternatively, the pin may extend from the free area of the deformable diaphragm short within said at least one lateral stop. The electromechanical microsystem according to either one of these two features offers a satisfactory capability to adapt to a wide range of external members and applications.

The electromechanical microsystem may further comprise a so-called bottom stop supported by the wall of the cavity opposite to the free area of the deformable diaphragm, said bottom stop extending in the cavity towards the free area. It has a shape and dimensions configured to limit the deformation of the free area of the deformable diaphragm so as to protect the deformable diaphragm, and more particularly its free area, in particular from a possible pull-out, when affixing or gluing the external member. Moreover, the so-called bottom stop is shaped so as to limit the contact surface between the diaphragm and the wall of the cavity opposite to the free area of the deformable diaphragm. Alternatively or complementarily, the bottom stop is shaped so as to limit the contact surface between the diaphragm and the wall of the cavity opposite to the free area of the deformable diaphragm. This allows avoiding the diaphragm adhering to this wall.

The electromechanical transducer may be a piezoelectric transducer, preferably comprising a PZT-based piezoelectric material.

The electromechanical transducer may be a transducer with a static operation. Alternatively or complementarily, the electromechanical transducer may be a transducer with a vibratory operation at least at one resonance frequency, said at least one resonance frequency being preferably lower than 100 kHz, and even more preferably lower than 1 kHz.

The deformable medium hermetically contained in the cavity may comprise at least one amongst a fluid and/or a liquid, and microbeads, the fluid preferably having a viscosity in the range of 100 cSt at ambient temperature and pressure.

According to a non-limiting embodiment, the fluid has a compressibility comprised between $10^{-9}$ and $10^{-10}$ Pa$^{-1}$ at 20° C., for example in the range of $10^{-10}$ Pa$^{-1}$ at 20° C., without these values being restrictive.

The electromechanical microsystem as introduced hereinabove may further comprise a plurality of deformable diaphragms and/or a plurality of free areas per deformable diaphragm and/or a plurality of electromechanical transducers.

Said at least one optical microsystem of the opto-electromechanical microsystem as introduced hereinabove may comprise at least one mirror also referred to as micro-mirror, preferably silicon-based.

According to one example, the opto-electro-mechanical system is configured so that the movement of the movable portion of the electromechanical transducer causes a displacement of the at least one mirror.

By "electromechanical microsystem", it should be understood comprising at least one mechanical element and at least one electromechanical transducer made in the micrometric scale with means of the microelectronics industry. The electromechanical transducer could detect a movement of the mechanical element; the electromechanical microsystem then serves as a sensor. Alternatively or complementarily, the mechanical element could be set in movement (actuated) thanks to a force generated by the electromechanical transducer. The electromechanical microsystem then serves as an actuator or gripping device.

The electromechanical transducer may be powered by electric voltages produced with neighbouring electronic circuit.

A "microsystem" is a system whose outer dimensions are smaller than 1 centimetre ($10^{-2}$ metres) and preferably than 1 millimetre ($10^{-3}$ metres).

Most often, an electromechanical transducer serves as an interface between the mechanical and electrical domains. Nonetheless, by "electromechanical transducer", it should herein be understood a piezoelectric transducer, as well as a thermal transducer, the latter serving as an interface between the mechanical and thermal domains. An electromechanical transducer may comprise a movable portion between a balance position, off-load, and an out-of-balance position, under load. In the case where the transducer is piezoelectric, the load is electric. In the case where the transducer is thermal, the load is thermal.

When mention is made of the centre of the cavity, this centre is defined geometrically by considering the centre of a cavity having a non-deformed free area of the deformable diaphragm.

By "lower" and "higher", it should be understood "lower than or equal to" and "higher than or equal to", respectively. Equality is excluded by the use of the terms "strictly lower" and "strictly higher".

By a parameter "substantially equal to/higher than/lower than" a given value, it should be understood that this parameter is equal to/higher than/lower than the given value, more or less 20%, possibly 10%, of this value. By a parameter "substantially comprised between" two given values, it should be understood that this parameter is at least equal to the lowest given value, more or less 20%, possibly 10%, of this value, and at most equal to the highest given value more or less 20%, possibly 10%, of this value.

Figure 3A:
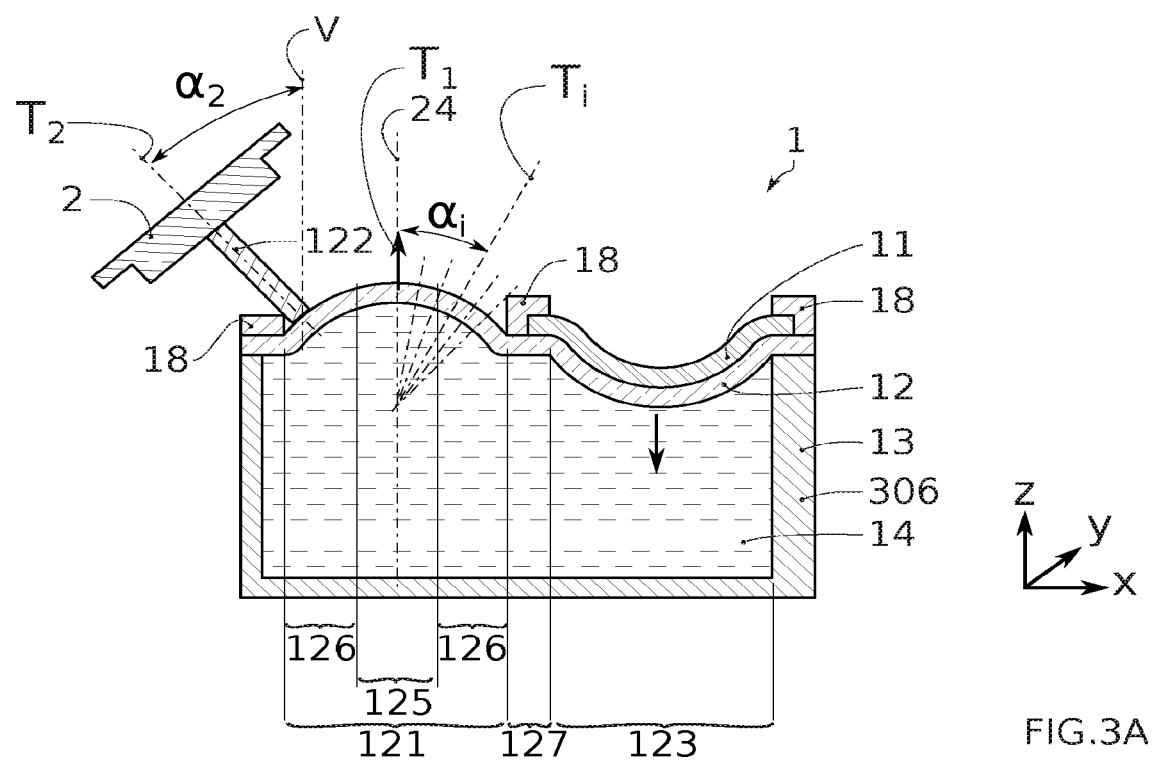
FIG. 3A represents the microsystem illustrated in FIGS. 1 and 2, in a first deformation configuration of the diaphragm.
Figure 3B:
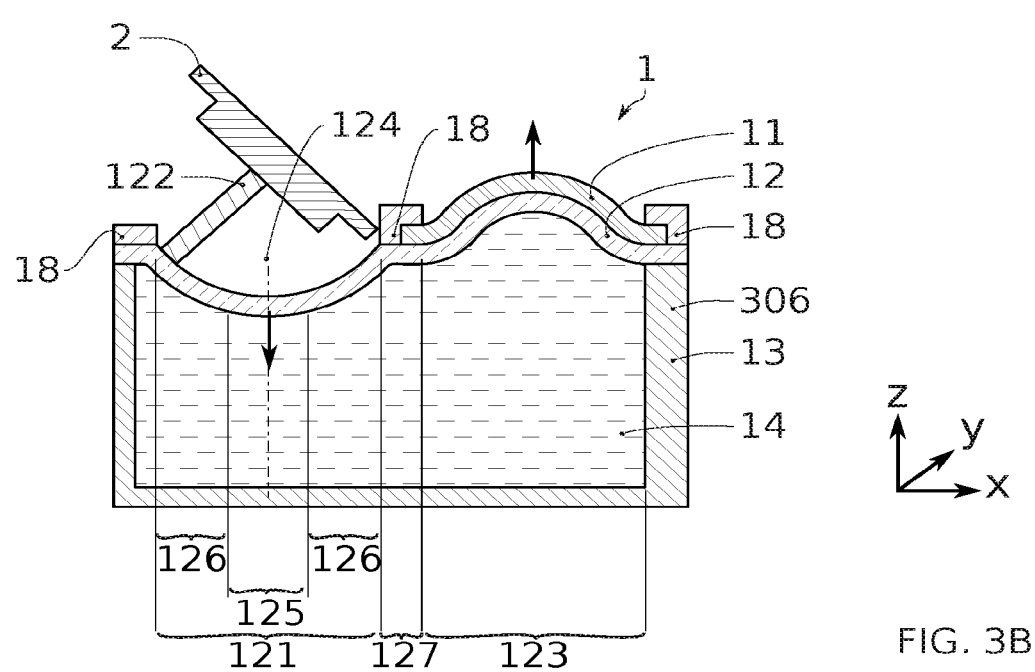
FIG. 3B represents the microsystem illustrated in FIGS. 1 and 2, in a second deformation configuration of the diaphragm.
Figure 6A:
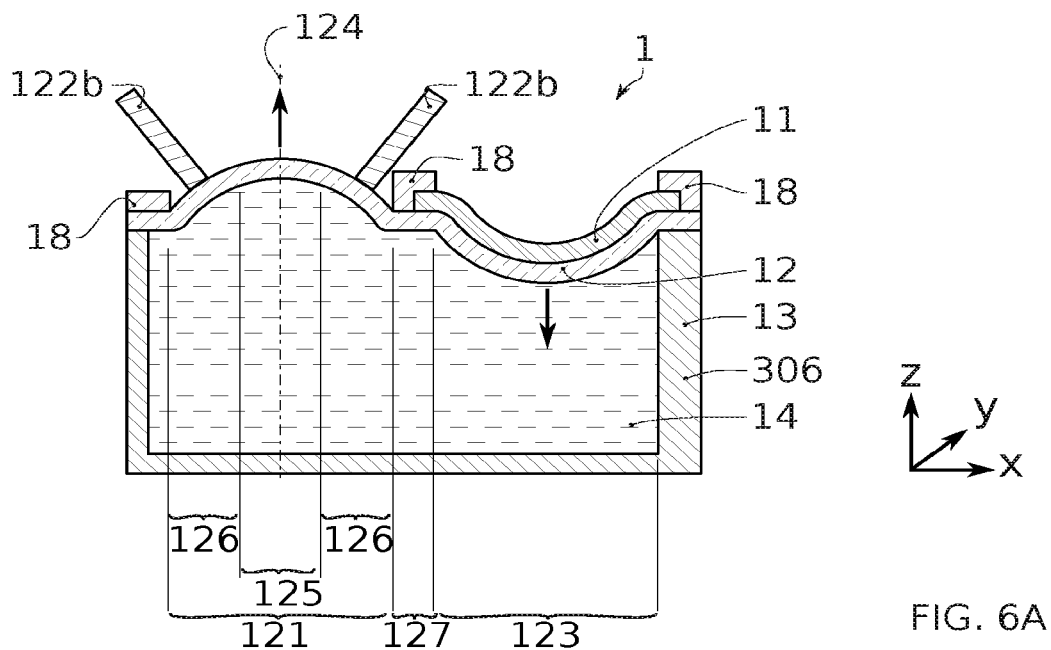
FIGS. 6A to 6E represent the microsystem illustrated in FIGS. 4 and 5, in a deformation configurations of the diaphragm.
Figure 6B:
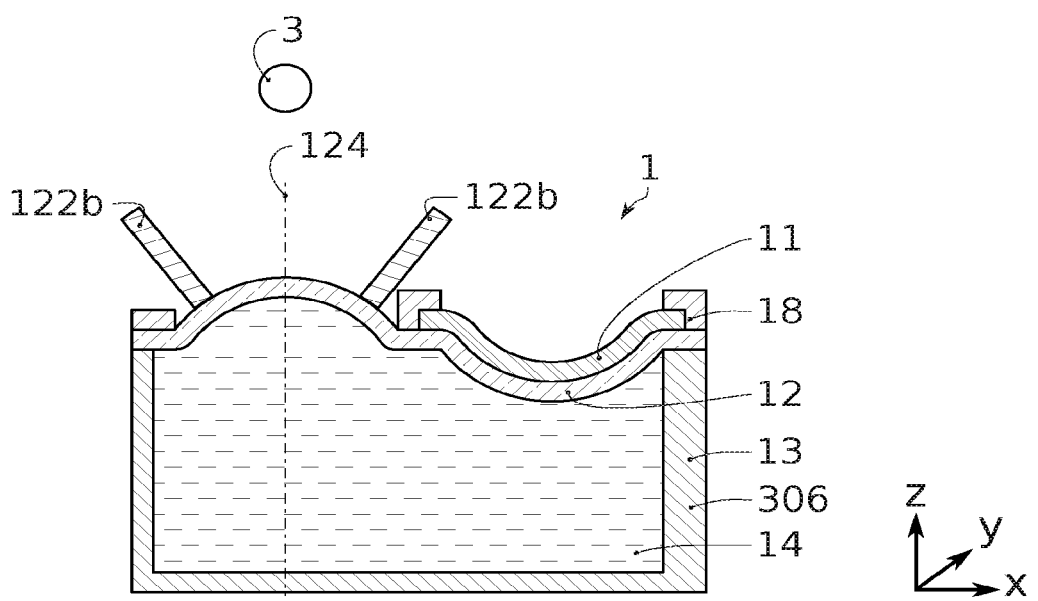
Figure 6C:
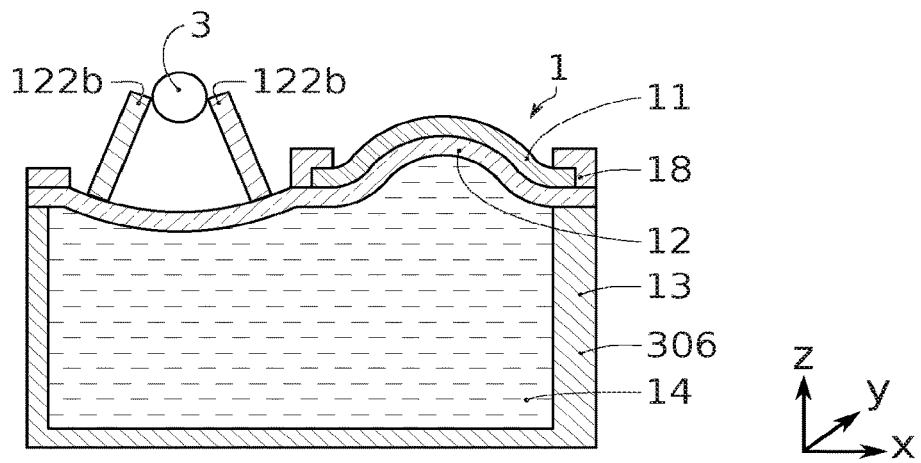
Figure 6D:
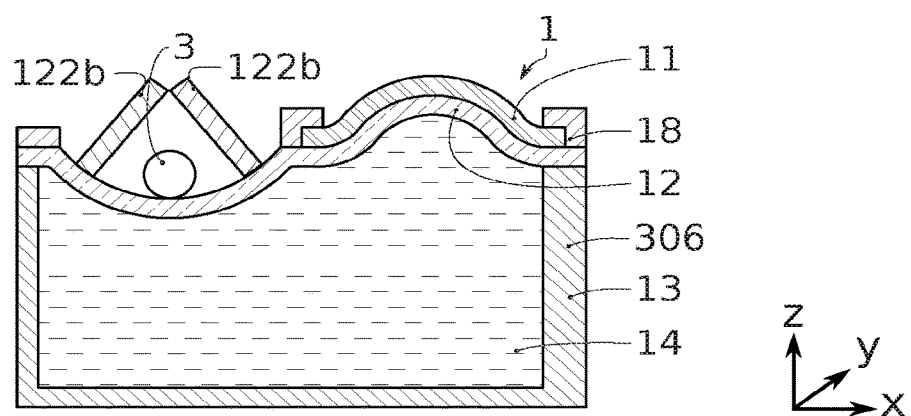
Figure 7A:
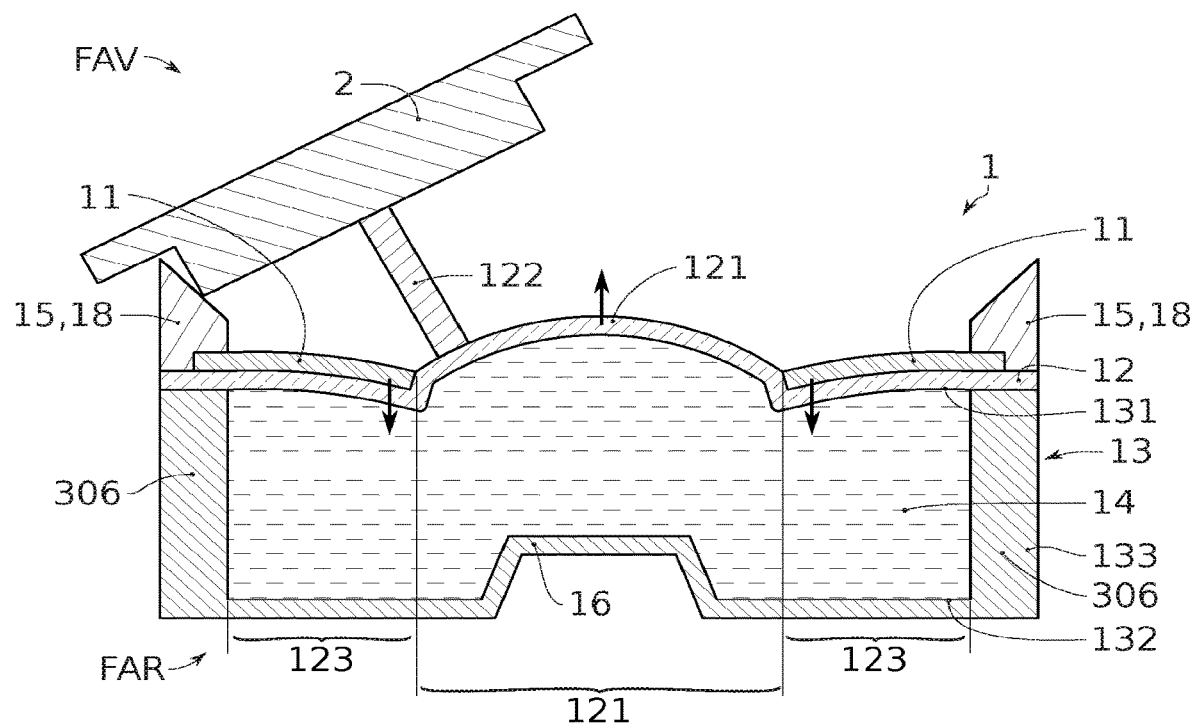
FIGS. 7A and 7B are block diagrams, in sectional view, of an electromechanical microsystem according to another embodiment of the invention wherein the electromechanical actuator surrounds the free area of the diaphragm. In this embodiment, lateral stops are provided.
Figure 7B:
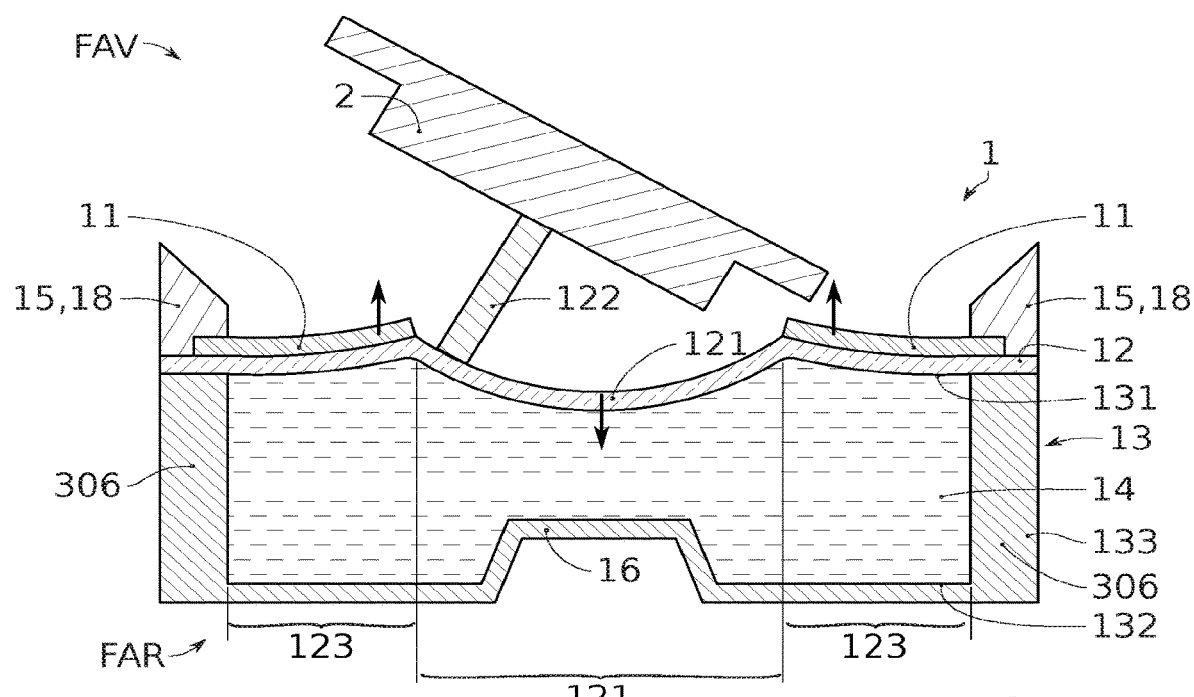

As this will be described in more details later on, depending on its configuration and its use, the electromechanical microsystem 1 according to the invention may ensure several functions:

as an actuator, it could allow displacing an object such as an external member 2 by tilting it in a first direction, (for example to the left) as illustrated in FIGS. 3A and 7A, or in a second direction (for example to the right), as illustrated in FIGS. 3B and 7B, As a gripping device, it could allow capturing or expelling an object 3 as illustrated in FIG. 6B, grasping an object 3 as illustrated in FIG. 6C, or else holding an already captured object 3 as illustrated in FIG. 6D, As a sensor, it could allow detecting a displacement, in particular an inclination. The features allowing ensuring these different functions will now be described in details with reference to the figures.

Figure 2:
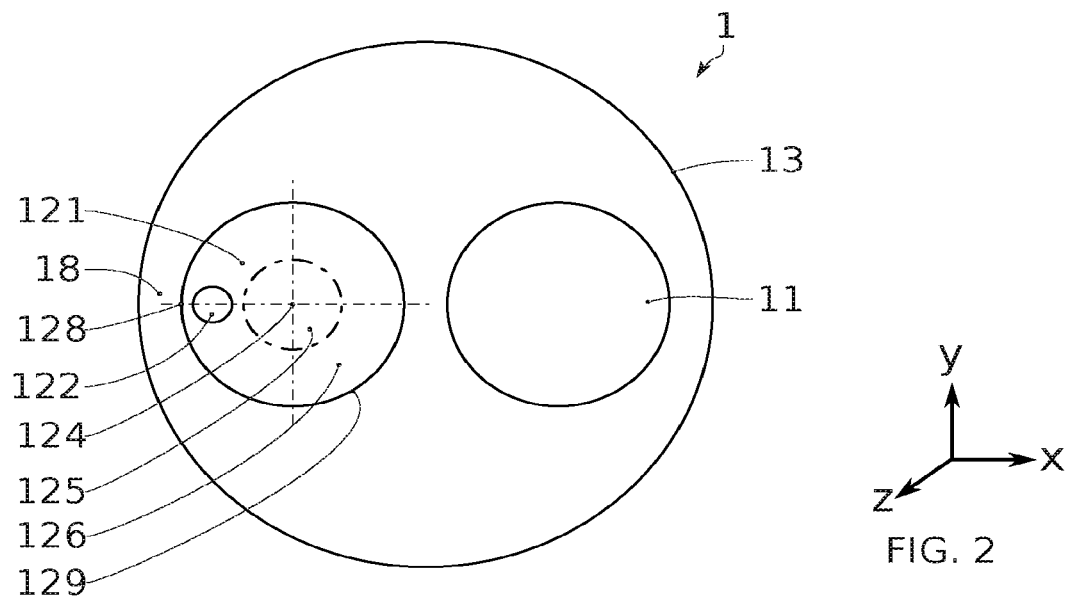
FIG. 2 is a block direction in top view of the electromechanical microsystem illustrated in FIG. 1.

FIGS. 1 and 2 are block diagrams, respectively of sectional and top views, of an example of the electromechanical microsystem 1 according to the invention. FIGS. 3A and 3B illustrate the electromechanical microsystem of FIGS. 1 and 2, during use.

In FIG. 1, an electromechanical transducer 11, a deformable diaphragm 12 and a cavity 13 configured to hermetically contain a deformable medium 14, are illustrated Before describing the different embodiments of the invention illustrated in the figures in more details, note that each of these illustrations schematically represents an embodiment of the electromechanical microsystem which has a structure that is not open-through. More particularly, in the different illustrated embodiments, the electromechanical transducer 11 and the deformable diaphragm 12 is located at the front face FAV of the electromechanical microsystem 1. This structure type is particularly advantageous to the extent that the rear face FAR of the electromechanical microsystem 1 could participate only in a passive manner, and in particular without being deformed, in the actuator and/or gripping device and/or sensor function of the electromechanical microsystem 1. More particularly, the rear face FAR of an electromechanical microsystem 1 with a structure that is not open-through according to the invention may, in particular, form a face by which the electromechanical microsystem 1 could be easily mounted on a support and/or may form a face by which the electromechanical microsystem could be easily functionalised further.

Nonetheless, the invention is not limited to electromechanical microsystems with a structure that is not open-through. The invention also relates to so-called electromechanical microsystems 1 with an open-through structure wherein the electromechanical transducer 11 and the deformable diaphragm 12 are arranged over distinct walls of the cavity 13, whether these walls are adjacent or opposite to each other.

Electromechanical Transducer 11

The electromechanical transducer 11 comprises at least one movable portion 111. The latter is configured so as to move or be moved between at least two positions. A first one of these positions is in a balance position reached and held when the electromechanical transducer 11 is not loaded, for example whether by an electric current powering it or by a force urging it off its balance position. A second position of the movable portion 111 of the electromechanical transducer 11 is reached when the electromechanical transducer 11 is loaded, for example whether by an electric current powering it or by a force urging it off its balance position. The electromechanical transducer 11 could be kept in either one of the above-described first and second positions, and thus have a binary behaviour, or could further be kept in any intermediate position between its balance position and its largest separation or largest deformation position, with respect to equilibrium.

In the illustrated example, when the electromechanical transducer 11 is not loaded, its movable portion 111 extends primarily in a plane parallel to the plane xy of the orthogonal reference frame xyz illustrated in FIG. 1.

Preferably, the electromechanical transducer 11 is a piezoelectric transducer. Each electromechanical transducer 11 comprises at least one piezoelectric material mechanically coupled to another element, described as a support or beam. The term beam does not limit, in any manner whatsoever, the shape of this element.

In a known manner, one property of a piezoelectric material is to be stressed when subjected to an electric field. When stressed, it is deformed. Mechanically associated to the support, the piezoelectric material seizes the support with it and then displaces the latter. The area of the support that could be displaced corresponds to the movable portion 111. It is this displacement property that is used to form an actuator.

Similarly, under the action of a mechanical stress, a piezoelectric material is electrically polarised. Thus, when the support is moved, it deforms the piezoelectric material which induces an electric signal. It is this property that is used to form a sensor.

Hence, from this example, yet this remains possibly true for each of the other considered embodiments of the electromechanical transducer 11, it arises that the electromechanical microsystem 1 according to the invention could operate as an actuator and/or as a gripping device and/or as a sensor.

Even more preferably, the electromechanical transducer 11 is a piezoelectric transducer comprising a PZT-based (lead zirconate titanate) piezoelectric material. In this case, the movable portion 111 of the electromechanical transducer 11 could, under load, move with a more significant displacement (because of the piezoelectric coefficient d31) than with many other piezoelectric materials. Nonetheless, PZT being a ferroelectric material, such a piezoelectric transducer preferably operates in one single actuation direction (movement of its movable portion 111 in one direction) irrespective of the polarity of its electric power supply, while a piezoelectric transducer based on a non-ferroelectric material could preferably operate in both directions (movement of its movable portion 111 in two opposite directions). Alternatively or complementarily, the electromechanical transducer 11 may be a (non-ferroelectric) piezoelectric transducer based on a material adapted to enable its movable portion 111 to move in opposite directions with respect to its balance position, for example as a function of the polarity of its electric power supply. For example, such a material is a material based on aluminium nitride (AlN).

Alternatively or complementarily, the electromechanical transducer 11 may be or comprise a thermal transducer.

Deformable Diaphragm 12

The deformable diaphragm 12 may be based on a polymer, and is preferably based on PDMS. The properties of the deformable diaphragm 12 in particular its thickness, its surface area and its shape may be configured so as to confer on the deformable diaphragm 12, and more particularly on the area 121 of this diaphragm which is freely deformable, a targeted stretch capacity, in particular according to the targeted application.

Cavity 13

The cavity 13 may feature a rotational symmetry or axisymmetry around an axis z perpendicular to the plane xy, as illustrated in FIG. 2. Alternatively, the cavity may have, when viewed from the top, a polygonal shape, for example as illustrated in FIGS. 17A to 17D which will be described in detail later on.

As illustrated in particular in FIGS. 1, 3A and 3B, the cavity 13 has more to particularly walls 131, 132, 133 hermetically containing the deformable medium 14. In the illustrated examples, the wall 132 of the cavity 13 forms the rear face FAR of the electromechanical microsystem 1. The wall 131 opposite to the wall 132 is formed at least partially by at least one portion of the deformable diaphragm 12. Thus, the wall 131 is deformable. Next, the wall 131 may sometimes be referred to as the first wall. It is located at the front face FAB of the electromechanical microsystem 1. At least one lateral portion 133 joins the walls 131 and 132 together. It should be noted that the hermeticity of the cavity 13 requires the deformable diaphragm 12 being itself watertight, or made watertight, in particular at its free area 121. Preferably, the walls 132, 133 remain fixed when the diaphragm is deformed.

In turn, the deformable medium 14 could keep a substantially constant volume under the action of a change in the external pressure. In other words, it may consist of an incompressible or barely compressible medium the deformation of which preferably requires little energy. For example, it consists of a liquid.

Since at least one portion of the first wall 131 of the cavity 13 is formed by at least one portion of the deformable diaphragm 12, it should be understood that any change in the external pressure exerted on the deformable medium 14 could be compensated by a substantially proportional deformation of the deformable diaphragm 12, and more particularly of its free area 12 (operation as an actuator or as a gripping device) and/or by a displacement of the movable portion 111 of the electromechanical transducer 11 (operation as a sensor). When the transducer 11 is loaded, this compensation is more particularly related to a conversion of the change in the external pressure exerted on the deformable medium 14 into a stretching of the deformable diaphragm 12 or a relaxation of the already stretched deformable diaphragm 12. It should be recalled that the deformable medium 14 is preferably non-compressible and that these stresses are therefore preferably imparted with a conservation of the volume of the cavity 13. It should be understood that, for reasons relating to the repeatability of the actuation or of the detection of the movement allowed by the electromechanical microsystem 1 according to the invention, it is preferably that any deformation of the deformable diaphragm 12 is elastic, and not plastic, in order to guarantee the return of the deformable diaphragm 12 to the same minimum stretch or maximum relaxation state, once it is no longer stressed.

As illustrated in each of FIGS. 1, 3A and 3B, the electromechanical transducer 11 may form a portion of the first wall 131 of the cavity 13. Thus, the electromechanical transducer 11 and the deformable diaphragm 12 are placed on the same side of the cavity 13. Advantageously, as mentioned hereinabove, the structures having this feature are not to open-through.

In this non-limiting example, the diaphragm 12 has an inner face 12i configured to be in contact with the deformable medium 14 and an outer face 12e. The inner face 12i forms at least one portion of the wall 131 of the cavity 13. The electromechanical transducer 11, more specifically the movable portion 111 of the latter, has an inner face 11i directed opposite, and preferably in contact with, the outer face 12e of the diaphragm 2. The electromechanical transducer 11 also has an outer face 11e, opposite to the inner face 11i, and directed towards the outside of the electromechanical microsystem 1. Alternatively, it is possible to provide for one or several intermediate layer(s) being disposed between the outer face 12e of the diaphragm 12 and the inner face 11i of the electromechanical transducer 11. The electromechanical microsystem 1 is configured so that the movement of the movable portion 111 of the electromechanical transducer 11 causes a displacement of the diaphragm 12 and therefore of the wall 131 which encloses the medium 14.

Notice that, in each of FIGS. 1 to 3B:
the electromechanical transducer 11 extends over the deformable diaphragm 12, and
the deformable diaphragm 12 separates the electromechanical transducer 11 from the deformable medium 14.

Furthermore, the electromechanical transducer 11 may advantageously be secured to the deformable diaphragm 12 at least over an area 123 located outside the free area 121, and more particularly substantially adjacent to the free area 121, so that any movement of the movable portion 111 of the electromechanical transducer 11 induces, in particular over this area 123, a stretching or a relaxation of the deformable diaphragm 12. Thus, in the example illustrated in FIG. 3A, when the electromechanical transducer 11 is loaded so as to move downwards (as illustrated in FIG. 3A by the arrow extending from the electromechanical transducer 11), a decrease in the external pressure exerted on the deformable medium 14 is observed, which induces the stretching of the deformable diaphragm 12 upwards, i.e. towards the centre of the cavity 13.

Deformable Medium 14

More particularly, the deformable medium 14 may comprise at least one amongst a fluid and/or a liquid. The parameters of the liquid will be adapted according to the targeted applications. Thus, it is ensured that any change in the external pressure exerted on the deformable medium 14 induces a substantially proportional deformation of the free area 121 of the deformable diaphragm 12. The fluid may consist of or be based on a liquid, to such as oil, or consist of or be based on a polymer. According to one example, the fluid is based on or consists of glycerine. Thus, in addition to a substantially proportional deformation of the diaphragm 12, the deformation of the electromechanical transducer 11, the capability of the deformable medium 14 to occupy in particular the volume created by stretching of the free area 121 of the deformable diaphragm 12 opposite to the centre of the cavity 13 is ensured.

In the case where the electromechanical microsystem 1 serves as an actuator or as a gripping device, the electromechanical transducer 11 is loaded so as to exert a change in the external pressure on the deformable medium 14 and therefore induce the deformation of the deformable diaphragm 12. Conversely, when the electromechanical microsystem 1 serves as a sensor, the deformation of the diaphragm 12 exerts a change in the external pressure on the deformable medium 14 which induces a displacement of the movable portion 111 of the electromechanical transducer 11 and consequently generates an electric signal.

Pin 122

As illustrated in FIGS. 1 to 3B, the electromechanical microsystem 1 is such that the free area 121 of the deformable diaphragm 12 is configured to cooperate with at least one finger, generally referred to as pin 122. The terms "finger" and "pin" are interchangeable. The term "pin" is not limited to parts with a constant section and all the more to cylindrical parts.

More specifically, the pin 122 bears on an outer face 12e of the free area 121. In this manner, the deformation of the free area 121 induces, or is induced by, a movement of the pin 122. Hence, it is through the free area 121 of the deformable diaphragm 12 that the electromechanical microsystem 1 displaces the pin 122 or detects a movement of the pin 122. Thus, in the case where the electromechanical microsystem 1 serves as an actuator or a gripping device, the activation of the electromechanical transducer 11 deforms the diaphragm 12 which displaces the pin 122. Conversely, in the case where the electromechanical microsystem 1 serves as a sensor, a pressure or a pull imposed on the pin 122, for example by an external member 2, generates a deformation (compression or tension) on the diaphragm 12, which displaces the electromechanical transducer 11 and then ultimately generates a signal that could depend on this displacement.

In the case of an actuator or of a sensor, the displacement of the object or the detection of the displacement of the object could be performed through an external member 2 which cooperates with the pin 122.

The electromechanical microsystem 1 may comprise several pins 122. The pins 122 of the same electromechanical microsystem 1, and possibly the pins 122 of the same free area 121, may have different shapes and/or dimensions. In particular, the pins may have different heights. For example, this allows adapting to the objects that are to be displaced, captured, or whose displacement is to be detected, and possibly measured.

Positioning of the Pin 122 on the Diaphragm 12

As illustrated in FIGS. 1 to 18B, the pin 122 is not fastened at the centre of the free area 121 of the deformable diaphragm 12. The pin 122 is positioned in an offset manner on the free area 121.

In more detail and as illustrated in FIGS. 1 to 3B for example, the free area 121 of the diaphragm 12 has a central portion 125 and a peripheral portion 126 which extends from the central portion 125 and up to a boundary, also referred to as outer perimeter 129 of the free area 121. In the example illustrated in FIGS. 1 to 3B, the diaphragm 12 forms a disk. The central portion 125 also forms a disk centred on a centre 124 of the free area 121. The peripheral portion 126 forms a ring surrounding the central portion 125.

For example, the outer perimeter 129 is defined by a cowl 18 which holds the diaphragm 12. Thus, the diaphragm 12 is located between the cowl 18 and the deformable medium 14. For example, this cowl 18 extends in the plane xy. It has at least one opening which defines the free area 121. In FIGS. 1 and 2, it appears that the cowl 18 extends over the entire surface of the cavity 13, projected on the plane xy, except for an opening defining the free area 121 of the diaphragm 12 and for at least one other opening 123 in which a portion of the electromechanical transducer 11, and in particular its movable portion 111, is accommodated. The cowl 18 has an area 127 (illustrated in particular in FIG. 1) that separates these two openings 121 and 123.

The pin 122 is configured to bear on the peripheral portion 126 of the free area 121 so that a deformation of the free area 121 of the diaphragm 12 causes an inclination of the pin 122.

According to one example, the pin 122 has a first end 122a bearing, directly or ndirectly, on the outer face 12e of the free area 121. It also has a second end 122b. According to a non-limiting embodiment, the pin 122 extends, between its first end 122a and its second end 122b, primarily according to a unique direction, referred to as longitudinal direction 122c. For example, the pin 122 has a cylindrical or tubular shape, with a circular, ovoid or polygonal section. When the free area 121 is deformed, its longitudinal direction 122c tilts in a plane perpendicular to the plane xy.

According to an alternative embodiment, the pin 122 does not have a cylindrical shape. For example, it may have a curved shape. The features and technical advantages mentioned hereinbelow remain valid if the pin 122 has a curved shape or others.

Inclination of the Pin 122

The inclination of the pin 122 will now be described in detail with reference to FIGS. 3A and 3B.

According to a non-limiting example, in the absence of deformation:
- the free area 121 of the diaphragm 12 extends primarily in the plane xy, called off-deformation plane, and
- the perpendicular to the tangent of the diaphragm 12, at a given point of the free area 121, extends according to a direction T1 perpendicular to the off-deformation plane.

When the diaphragm 12 is deformed, the perpendicular to the tangent at a given point of the peripheral portion 126 of the free area 121 extends according to a direction Ti, inclined with respect to the direction T1, by an angle αi. The angle αi is measured in a plane perpendicular to the off-deformation plane xy. The angle αi is illustrated in FIG. 3A. When deformed, the free area 121 of the diaphragm 12 generally has a shape of sphere portion, a dome or a bell from its outer perimeter 129. Thus, the angle αi increases when getting away from the central portion 125 and approaching the outer perimeter 129.

In the illustrated example, the longitudinal direction 122c of the pin 122 extends according to a direction T2 perpendicular to the tangent of the diaphragm at the point where the end 122a of the pin 122 bears on the free area 121. Thus, when the free area 121 is deformed, the longitudinal direction 122c of the pin 122 tilts. In FIG. 3A, when the diaphragm 12 is deformed, the longitudinal direction 122c of the pin forms an angle α2 with the off-deformation direction 122c.

With this schematic example, one could clearly see that the suggested electromechanical microsystem 1 allows for a particularly large angular stroke for a given deformation of the free area 121 of the diaphragm 12. Thus, the suggested solution allows considerably amplifying the movement of the end 122b of the pin 122.

When the pin 122 is connected to an object such as an external member 2, and:
- the electromechanical microsystem 1 serves as an actuator, this allows amplifying the angular stroke imposed on this external member 2, and
- the electromechanical microsystem 1 serves as a sensor, this allows detecting a displacement of the external member 2.

The provided electromechanical microsystem 1 also offers many advantages when it serves as a gripping device. Next, these advantages will be described in details with reference to FIGS. 4 to 6E.

A displacement of the movable portion 111 of the electromechanical transducer 11 in a first direction (herein primarily according to the axis z) causes a deformation of the free area 121 of the diaphragm 12 in a second direction opposite to the first direction, and induces an inclination of the pin 122 in a first direction. Thus, as illustrated in FIG. 3A and with reference to the reference frame xyz, the downward displacement of the movable portion of the electromechanical transducer 11 causes an upward deformation of the free area 121 of the diaphragm 12, and a leftward inclination of the longitudinal direction 122c of the pin 122. Conversely, as illustrated in FIG. 3B, an upward displacement of the movable portion 111 of the electromechanical transducer 11 causes a downward deformation of the free area 121 of the diaphragm 12, and induces a rightward inclination of the original direction 122c of the pin 122.

According to one example, and with reference to FIG. 1, the pin 122, more specifically its first end 122a, is located at a minimum distance D122 from a point 128 of the outer perimeter 129, such that D122 is smaller than k times the distance D124 measured between this same point 128 and the centre 124 of the free area 121.

The point 128 is the point of the outer perimeter 129 the closest to the pin 122. Preferably, k is less than 0.7, preferably k is less than 0.5 and preferably k is less than 0.3. More generally, the more the pin 122 will be positioned proximate to the boundary of the free area 121, the larger will be the inclination of the pin 122 for the same deformation of the diaphragm 12. Thus, the amplitude of the obtained stroke is increased.

Attachment of the Pin 122 and of the External Member 2

Without limitation, a gluing or a magnetisation of the pin 122 on the external member 2 could allow securing the pin 122 and the external member 2 together. Preferably, the energy of adhesion of the pin 122 on the free area 121 of the deformable diaphragm 12 is higher than that of the pin 122 on the external member 2. The energy of adhesion of the pin 122 on the free area 121 could be obtained through technological steps that are ordinary in the microelectronics industry. Thus, since this adhesive energy could be estimated or measured, it is, for example, easy to obtain by gluing, for example using an ad hoc resin, or by magnetisation, an attachment that has a lower energy than the energy with which the pin 122 is secured to the deformable diaphragm 12. Hence, it should be understood that the attachment between the pin 122 and the external member 2 is thus greatly modular in terms of holding force. In particular, this modularity could allow making the attachment between the pin 122 and the external member 2 removable, for example in order to enable the same electromechanical microsystem 1 according to the invention to e successively arranged with several external members 2 with each it would be secured, to and then detached.

Gripping Device: Embodiment Illustrated in FIGS. 4 to 6E:

Referring to FIGS. 4 to 6E, an embodiment wherein the electromechanical microsystem forms a gripping device will now be described. All of the features and all of the technical effects mentioned before with reference to the embodiments of FIGS. 1 to 3B are still perfectly applicable and combinable with the embodiments that have just been described with reference to FIGS. 4 to 6E. In particular, each of the previously-mentioned embodiments could have several pins 122 distributed over the free area 121 of the diaphragm 12.

Figure 4:
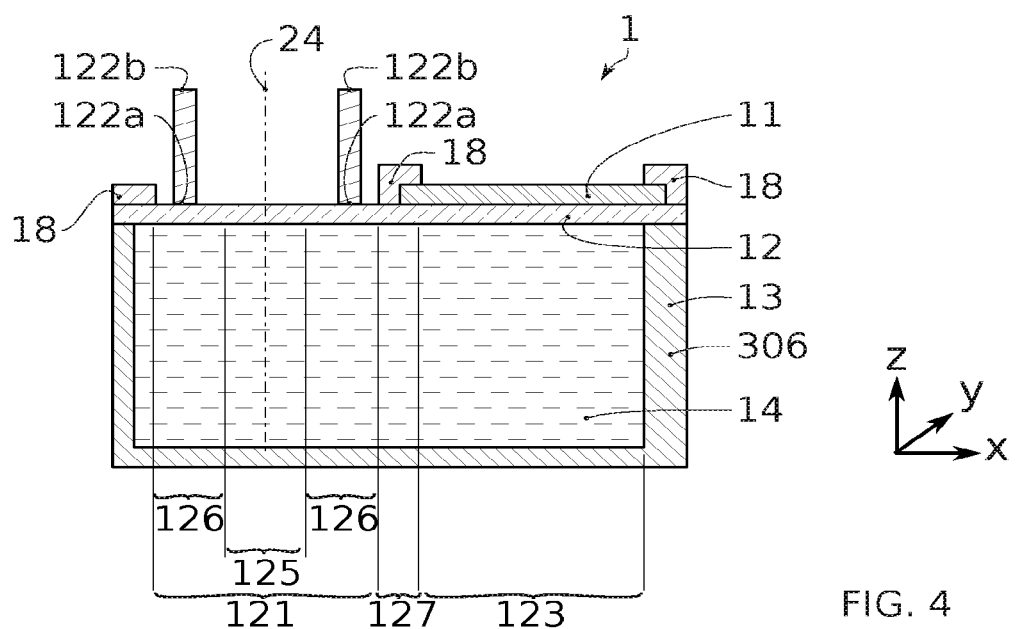
FIG. 4 is a block diagram of a sectional view of an electromechanical microsystem according to a second embodiment of the invention. In this second embodiment, the free area of the diaphragm cooperates with several pins.
Figure 5:
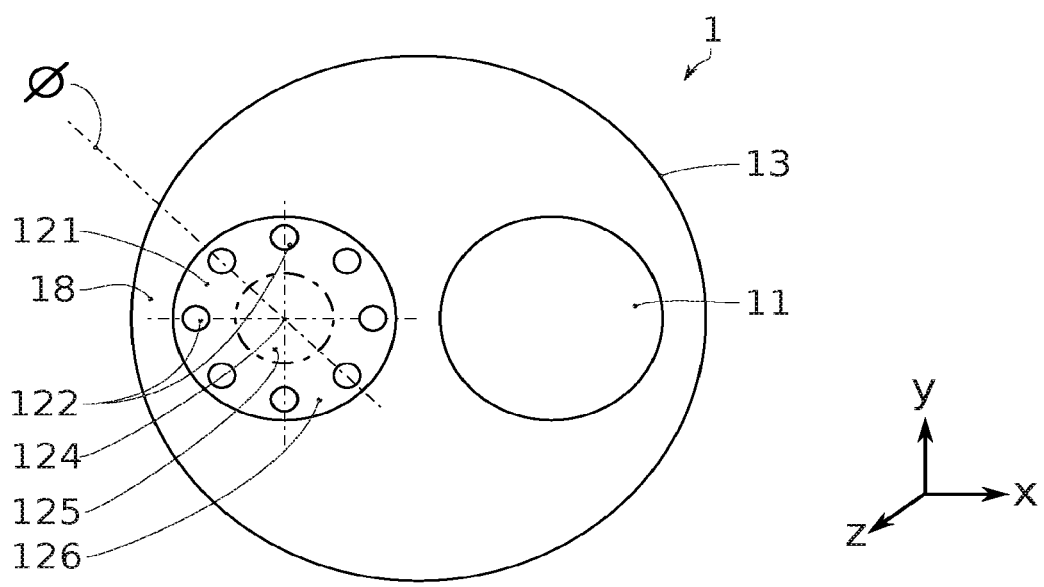
FIG. 5 is a block direction in top view of the electromechanical microsystem illustrated in FIG. 4.

The electromechanical microsystem 1 illustrated in FIGS. 4 and 5 comprises several pins 122. Preferably, these pins 122 are disposed in the peripheral area 126 of the free area 121 of the diaphragm 12. The electromechanical microsystem 1 is shaped so that the ends 122b of the pins 122 approach each other, or depart from each other according to the deformation of the free area 121.

As illustrated in FIG. 6A, when the movable portion 111 of the electromechanical transducer 11 is immersed in the deformable medium 14, the free area 121 is deformed while getting away from the deformable medium 14 and the free ends 122b of the pins 122 get away from each other. It is then possible to receive or capture an object 3 between the pins 122, as illustrated in FIG. 6B.

Figure 6E:
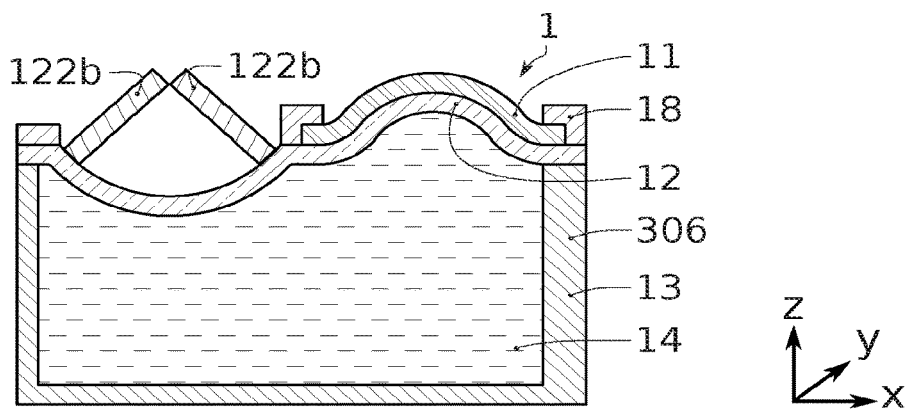

Conversely, as illustrated in FIGS. 6C to 6E, when the movable portion 111 of the electromechanical transducer 11 gets away from the deformable medium 14, the free area 121 is deformed while approaching the deformable medium 14 or while being immersed in the latter. The free ends 122b of the pins 122 then approach each other.

It is then possible to grasp an object 3, for example between the ends 122b, as illustrated in FIG. 6C. For example, this allows performing afterwards a step of treating the object 3, by suitable equipment. This treatment may comprise the modification of the object 3, for example by applying a coating thereon. This treatment may also comprise a step of analysing the object 3, the analysis may for example be optical, biological or else chemical.

As illustrated in FIG. 6D, approaching the free ends 122b of the pins 122 also allows enclosing the object 3 between the pin 122 and the diaphragm 12. Approaching their free ends 122b allows forming a cage holding an object 3 whose minimum dimension is larger than the space between two adjacent pins 122. Afterwards, it is possible to provide for displacing this object 3. For example, this embodiment could find application in objects sorting.

As illustrated in FIG. 6E, depending on the dimension of the pins 122 and on the dimension of the diaphragm 12, it is possible to provide for the free ends 122b coming into contact with each other. For example, this embodiment allows grasping objects with a very small size, such as millimetric, and possibly micrometric, objects.

For these embodiments wherein it is desired to grasp/capture/enclose/release an object 3 between the pins 122, at least two pins 122 are provided. Preferably, more than two pins are provided. This number of pins 122 is adapted according to the size of the object 3 to be held.

Preferably, the pins are evenly disposed over the peripheral portion 126 of the free area 121 of the diaphragm 12.

In the example illustrated in FIG. 5, eight pins 122 are disposed over the peripheral area 126. These pins are disposed in pairs symmetrically with respect to the centre 124 of the free area 121.

More generally, these pins 122 are disposed symmetrically with respect to an apex of the diaphragm 12 in its maximum deformation state. Typically, the pins 122 are disposed over the same diameter Ø of the free area 121. This is illustrated in FIG. 6.

Preferably, the number of pins 122 is greater than two. Preferably, it is greater than three. Preferably, the pins 121 are evenly disposed around the central portion 125 of the free area 121.

Another use of the electromechanical microsystem comprising at least two pins consists in stretching a deformable object. For example, such an object may be a deformable diaphragm (distinct from the deformable diaphragm 12), that would be attached on the at least two pins, so that the displacement of at least one of them, or of several ones of them in different, and possibly opposite, directions stretches the deformable diaphragm. Preferably, these at least two pins are disposed symmetrically with respect to the centre of the free area 121 of the deformable diaphragm 12.

According to an alternative example, the pins 122 are not symmetrically distributed and/or are not evenly distributed over the peripheral portion 126.

Embodiment of FIGS. 7A and 7B

Figure 7C:
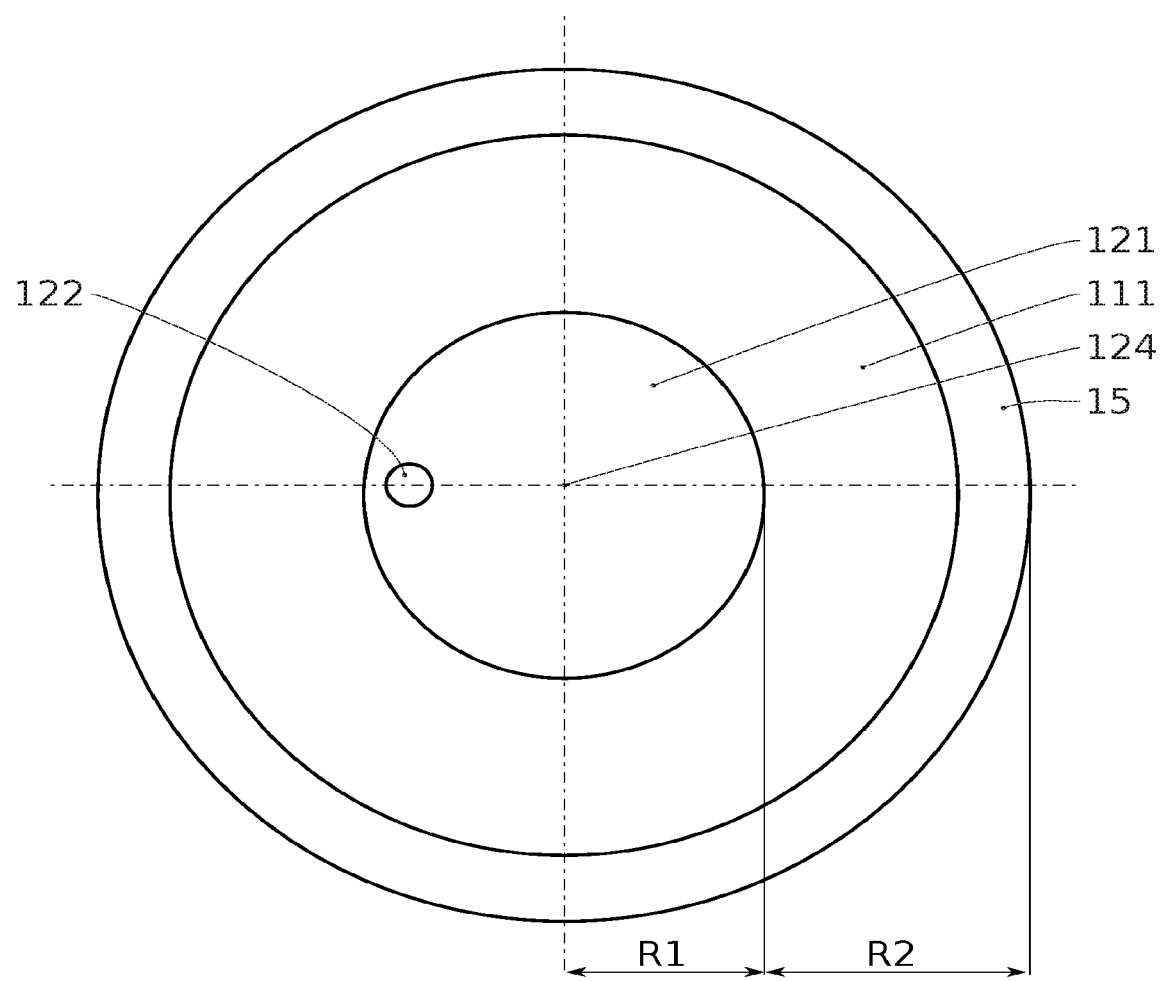
FIG. 7C is a block diagram in top view of the electromechanical microsystem illustrated in FIGS. 7A and 7B.

Referring to FIGS. 7A to 7C, other embodiments will now be described.

These other embodiments differ from the previous ones by the arrangement of the free area 121 with respect to the electromechanical transducer 11. All of the other features mentioned hereinabove with reference to the previous embodiments are still perfectly applicable and combinable with the other embodiments illustrated in FIGS. 7A and 7B. Similarly, all of the features and numerical values mentioned hereinbelow are perfectly to applicable and combinable with the previously-descried embodiments. In particular, for simplicity, one single pin 122 is represented in this example. Of course, the electromechanical microsystem 1 may comprise more than one pin 122.

Arrangement of the Free Area 121

In the previous embodiments, the free area 121 is separated from electromechanical transducer 11. Thus, a non-zero distance separates the free area 121 and the electromechanical transducer 11. For example, this non-zero distance is materialised by an area 127 of the cowl 18, as illustrated in FIG. 1.

In the embodiments of FIGS. 7A to 7C, the free area 121 is surrounded, at least partially, by at least one electromechanical transducer 11. As illustrated in FIGS. 7A to 7C, the electromechanical transducer 11 completely surrounds the free area 121. The electromechanical transducer 11 and the free area 121 could then be contiguous.

More specifically, as illustrated in FIG. 7C, the electromechanical transducer 11 is in the form of a ring with a radial extent denoted R2 and defines a circular free area 121 with a radius denoted R1. Note that the electromechanical transducer 11 is not limited to an annular shape, but could have other shapes, and in particular an oblong or oval shape, a triangular, rectangular shape, etc., defining a corresponding plurality of shapes of the free area 121 of the deformable diaphragm 12. This illustration applies in particular for a rotational symmetry or axisymmetry. Nevertheless, a corresponding illustration for a structure symmetrical with respect to the surface of the free area 121 could similarly be provided which would consist in particular of the representation of three strips, adjacent in pairs, where the central strip would represent the free area 121 of the deformable diaphragm 12 and whose lateral strips would represent the movable portion of the involved electromechanical transducer(s) 11.

In particular when the partial overlap of the deformable diaphragm 12 by the electromechanical transducer 11 is as illustrated in FIG. 7C and the electromechanical transducer 11 is a piezoelectric transducer comprising a PZT-based piezoelectric material, it is interesting that the movable portion 111 of the electromechanical transducer 11 has a urface at least twice as large, possibly at least 5 times larger, and preferably at least ten times larger than the surface of the free area 121 of the deformable diaphragm 12. Henceforth, the deformable diaphragm 12 is configured so that its free area 121 could be deformed with an amplitude of at least 50 µm, for example substantially equal to 100 µm, and possibly of several hundred µm. In general, the deformable diaphragm 12 is configured so that its free area 121 could be deformed with an amplitude lower than 1 mm. This deformation is measured according to a direction perpendicular to the plane in which the outer face 12e of the diaphragm 12 primarily extends at rest. Without tearing and/or without any significant wear, the electromechanical microsystem 1 allows for a hydraulic amplification of the action and thus offers the capability to address numerous and various applications requiring a large stroke. In this context, the electromechanical microsystem 1 illustrated in FIGS. 7A to 7C may be defined as an actuator with a large angular stroke.

The electromechanical microsystem 1 illustrated in FIG. 7A enables an inclination of the pin 122 to the left when the electromechanical transducer 11 is loaded. The electromechanical microsystem 1 illustrated in FIG. 7B enables an inclination of the pin 122 to the right when the electromechanical transducer 11 is loaded.

Also when the partial overlap of the deformable diaphragm 12 by the electromechanical transducer 11 is as illustrated in FIG. 7C and the electromechanical transducer 11 is a piezoelectric transducer comprising a PZT-based piezoelectric material, but with reference to FIGS. 8A and 8B discussed in more details hereinbelow, the electromechanical transducer 11 may comprise, more particularly, a support 305, also referred to as beam 305, and a PZT-based piezoelectric element 302, the latter being configured to induce a deformation of the support 305. The term beam 305 does not limit the shape of the support 305. In this example, the beam 305 forms a ring. The thickness of the piezoelectric element 302 may be substantially equal to 0.5 µm and the thickness of the beam 305 may be comprised for example between a few µm and several tens µm, for example substantially equal to 5 µm.

Still when the partial overlap of the deformable diaphragm 12 by the electromechanical transducer 11 is as illustrated in FIG. 7C and the electromechanical transducer 11 is a piezoelectric transducer comprising a PZT-based piezoelectric material, the radius R1 of the free area 121 of the deformable diaphragm 12 may be substantially equal to 100 µm and the radial extent R2 of the electromechanical transducer 11 (typically its radius if it is circular) may be substantially equal to 350 µm. The references R1 and R2 are illustrated in FIG. 7C. In such a configuration, the movable portion 111 of the electromechanical transducer 11 may be displaced or deflected with an amplitude for example substantially equal to 15 µm when subjected to an electric voltage for example substantially equal to 10 V for a beam 305 thickness substantially equal to 5 µm and a PZT thickness substantially equal to 1 µm.

Nonetheless, the invention is not limited to the different specific values given hereinabove which could be substantially adapted, depending on the targeted application, in particular to find a trade-off between the stretch factor and the expected amplitude of to deformation of the free area 121 of the deformable diaphragm 12.

It should be noted that, in its balance position, the movable portion 111 of the electromechanical transducer 11, and more generally the electromechanical transducer 11, could be not flat, but could, on the contrary, be convex or concave at balance, which does not deprive the electrically-powered electromechanical transducer 11 in any manner from its capability to move or deflect, in terms of amplitude.

Note that, in particular when the electromechanical transducer 11 is a piezoelectric transducer, the electromechanical transducer 11 may advantageously be a transducer with a vibratory operation. Its resonance frequency is then preferably lower than 100 kHz, and even more preferably lower than 1 kHz. The vibratory dynamics thus obtained could allow reaching larger strokes than is the case in static operation, in particular by exploiting the related resonance phenomenon or reducing the consumption of the electromechanical microsystem for a given stroke.

Lateral Stops

The electromechanical microsystem 1 may further comprise one or several lateral stop(s) 15 forming an end-of-travel stop for the pin 122 or for the possible external member 2 supported by the pin 122. The lateral stop(s) 15 are supported by the first wall 131 of the cavity 13. FIGS. 7A and 7B illustrate such an embodiment. In this embodiment, the free area 121 of the diaphragm 12 is surrounded by the movable portion 111 of the electromechanical transducer 11. More particularly, each lateral stop 15 extends opposite to the cavity 13. For example, each lateral stop 15 extends from a non-movable portion of the electromechanical transducer 11.

In the examples illustrated in FIGS. 7A and 7B, each lateral stop 15 may further have an action of holding a non-movable portion of the electromechanical transducer 11 in position, said non-movable portion being complementary with the movable portion 111 of the electromechanical transducer 11. In this respect, the lateral stop(s) 15 coincide with the cowl 18. For example, as illustrated in FIGS. 8A and 8B, the action of holding the non-movable portion of the electromechanical transducer 11 may be more particularly ensured by clamping thereof between the two lateral stops 15 and/or the cowl 18, and in particular that one located at a central portion of the microsystem 1, and the spacer 306, as introduced hereinbelow, which materialises the lateral wall 133 of the cavity 13; in this respect, the spacer 306 preferably extends towards the central portion of the microsystem 1 at least up to opposite the portion of the cowl 18 the closest to the central portion of the microsystem 1.

With respect to this or these lateral stop(s) 15, the pin 122 may extend, opposite to to the cavity 13. The lateral stop(s) 15 contribute(s) in limiting the angular stroke of the pin 122, and of the possible external member 2 associated to the pin 122.

This also allows reducing the risk of pull-out of the deformable diaphragm 12 when affixing the external member 2 on the electromechanical microsystem 1. Of course, for this purpose, the dimensions of the external member 2 are preferably configured so that the latter abuts on the lateral stops 15 upon fastening thereof on the pin 122. Of course, the dimensions and the shapes of the stops 15 and of the external member 2 should be adapted so that the latter abut on the lateral stop 15 located to the right of the electromechanical microsystem.

Note herein that, depending on the extent of the external member 2, the lateral stops 15 may also serve as a top stop limiting the approach of the external member 2 to the electromechanical microsystem 1. This particularity may also allow inducing a detachment of the pin 122 and of the external member 2 from each other by pulling the pin 122 in a position lower than that possibly reached by the external member 2 as the matter abuts on the top of the lateral stops 15. More specifically, the lateral stops 15 have a stop surface configured to stop the displacement of the member 2. The electromechanical microsystem 1 is configured so that when the displacement of the member 2 is stopped in its displacement, according to a given direction, by the lateral stops 15, the pin 122 could carry on its displacement, in this same direction. Thus, the pin 122 is detached from the member 2.

Bottom Stop

As illustrated in each of FIGS. 7A and 7B, the electromechanical microsystem 1 may further comprise one or several stop(s) at the end of travel, called bottom stops 16. This or these bottom stop(s) 16 are supported by the wall 132 of the first cavity 13 which is opposite to the wall 131 formed at least partially by the deformable diaphragm 12. It extends in the first cavity 13 towards the free area 121 of the deformable diaphragm 12. Preferably, this bottom stop 16 has a shape and dimensions configured to limit the deformation of the free area 121 of the deformable diaphragm 12 so as to protect the deformable diaphragm 12, and more particularly its free area 121, from a possible pull-out, in particular when affixing the pin 122 or the external member 2 on the electromechanical microsystem 1. Alternatively or complementarily, the bottom stop 16 is shaped so as to limit the contact surface between the diaphragm 12 and the wall 132 of the cavity 13 opposite to the free area 121 of the deformable diaphragm 12. This allows avoiding the diaphragm 12 adhering and sticking to this wall 132.

Figure 8A:
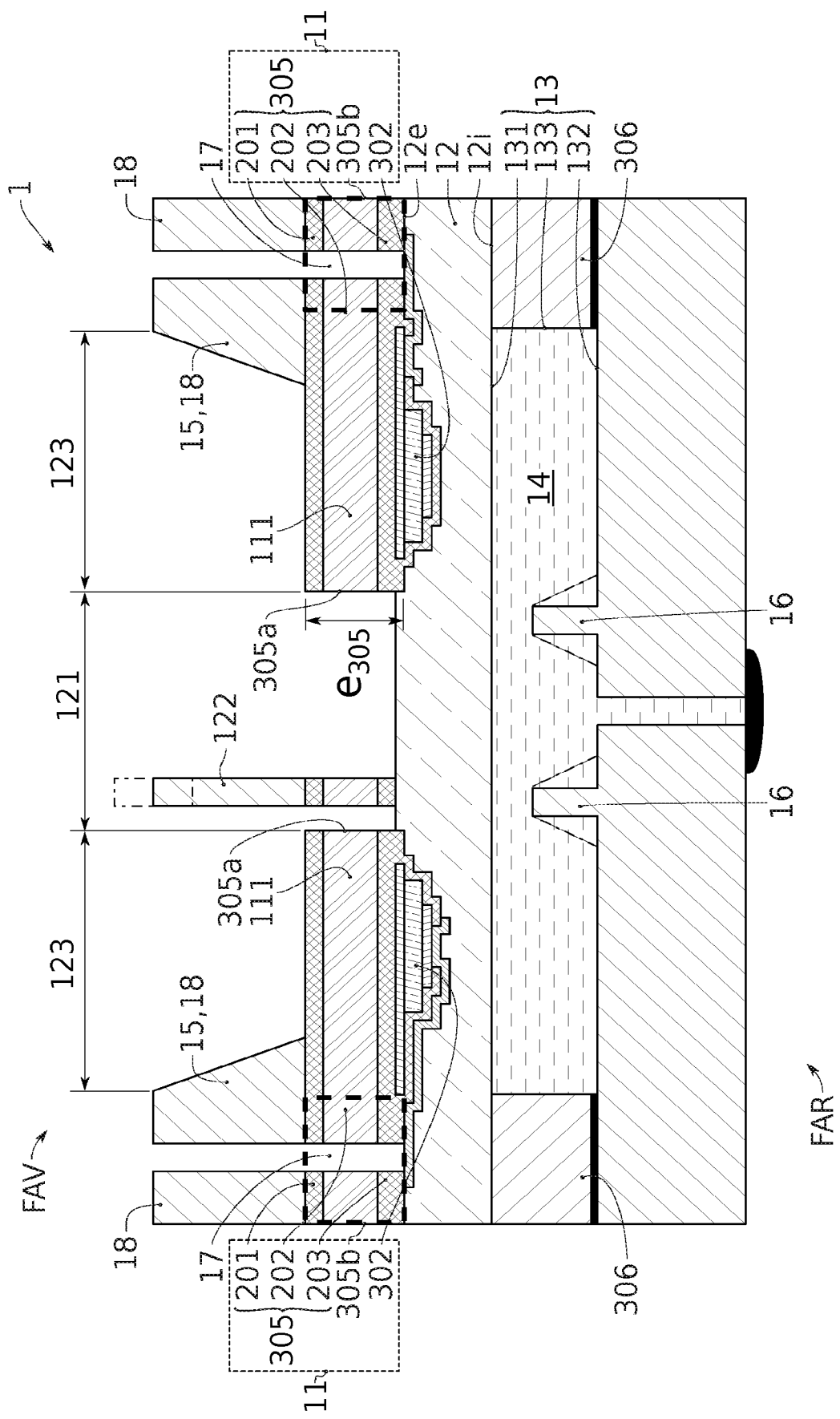

Embodiments of the invention that are more specific than those described to hereinabove are illustrated in FIGS. 8A and 8B wherein the same references as in FIGS. 7A and 7B refer to the same objects.

First of all, it is observed therein that each illustrated electromechanical transducer 11 comprises a support 305, also referred to as beam 305, and a piezoelectric material 302 configured to deform the support 305 when an electric voltage is applied thereto. The term beam 305 does not limit the shape of this support. In this example, the beam 305 forms a ring.

A comparison between FIGS. 8A and 8B shows that the piezoelectric material 302 could be located on either side of the neutral fibre of the set forming the beam 305. It is thanks to this alternative that a piezoelectric material whose deformation is not sensitive to the polarisation of the electric current flowing therethrough still allows deforming the beam 305 in either direction.

More particularly, in FIG. 8A, the piezoelectric material 302 is located under the beam 305, and therefore under the neutral fibre of the set, i.e. it is located between the beam 305 and the diaphragm 12. When an electric current flows through the piezoelectric material 302, it retracts and displaces the beam 305 with it. A free end 305a of the beam bends downwards, displacing with it a portion of the diaphragm 12 connected to the beam 305. In turn, by volume conservation, the free area 121 of the diaphragm moves upwards, thereby causing the upward displacement of the pin 122 and the inclination thereof, herein to the left. This case corresponds to that illustrated in FIG. 7A. Preferably, another end 305b of the beam 305 remains fixed. For example, this other end 305b is secured to a fixed wall 306 of the cavity 13 and to possible lateral stops 15. According to another embodiment, it is possible to provide for the end 305B being fastened to a cowl of the electromechanical microsystem 1. The cowl or the cavity of the electromechanical microsystem 1 is intended to be fastened on a support or a frame.

In FIG. 8B, the piezoelectric material 302 is located above the beam 305, i.e. the beam 305 is located between the piezoelectric material 302 and the diaphragm 12. When an electric current flows through the piezoelectric material 302, it retracts and displaces the beam 305 with it. A free end 305a of the beam bends upwards, pulling with it the portion of the diaphragm 12 connected to the beam 305. In turn, by volume conservation, the free area 121 of the diaphragm moves downwards, thereby causing the downward displacement of the pin 122 and the inclination thereof, herein to the right. This case corresponds to that illustrated in FIG. 7B.

In FIGS. 8A and 8B, one could also observe the different heights that the pin 122 could have in comparison with the height of the lateral stops 15. Herein again, one could observe that the lateral stops 15 and the bottom stops 16 could have different shapes, and in particular a parallelepiped shape, a frustoconical shape, a substantially pyramidal shape, etc.

In FIGS. 8A and 8B, one could further observe that the movable portion 111 of the electromechanical transducer 11 could be substantially defined by the extent of the piezoelectric material 302 with respect to the extent of the beam 305.

In FIGS. 8A and 8B, access openings for an electrical connection of the electrodes are represented. In these examples, these openings form vias 17 through the cowl 18. In this example, the vias 17 cross the entire thickness of the beam 305. The thickness $e_{305}$ of the beam 302 is measured according to a direction perpendicular to the plane in which the faces 12e and 12i of the diaphragm 12 primarily extend. The thickness $e_{305}$ is referenced in FIGS. 8A and 8B.

More particularly, FIGS. 8A and 8B illustrate third and fourth embodiments of the invention which have been obtained through deposition and etching steps which could be considered as ordinary in the microelectronics industry. More particularly, the electromechanical microsystem 1 according to the third embodiment illustrated in FIG. 8A has been obtained through the succession of steps illustrated by FIGS. 9A, 10A, 11A, 12A, 13A, 14A and 15A and the electromechanical microsystem 1 according to the fourth embodiment illustrated in FIG. 8B has been obtained through the succession of steps illustrated by FIGS. 9B, 10B, 11B, 12B, 13B, 14B and 15B. Thus, two manufacturing methods are illustrated each leading to one of the electromechanical microsystems 1 illustrated in FIGS. 8A and 8B.

At least one common feature of these manufacturing methods is that they comprise:
   a step of forming, over a substrate 200, what is intended to form at least one portion of the electromechanical transducer 11, then
   a step of depositing the deformable diaphragm 12, then
   a step of forming at least one open cavity 13 over the deformable diaphragm 12, then
   a step of filling with the deformable medium and closing the cavity 13, and
   a step of etching the substrate 200 to form the front face FAV of the electromechanical microsystems illustrated in FIGS. 8A and 8B.

Examples of Steps of Manufacturing Methods

We successively describe each of the aforementioned manufacturing methods hereinbelow, starting with the method for manufacturing the electromechanical microsystem 1 as illustrated in FIG. 8A.

Figure 9A:
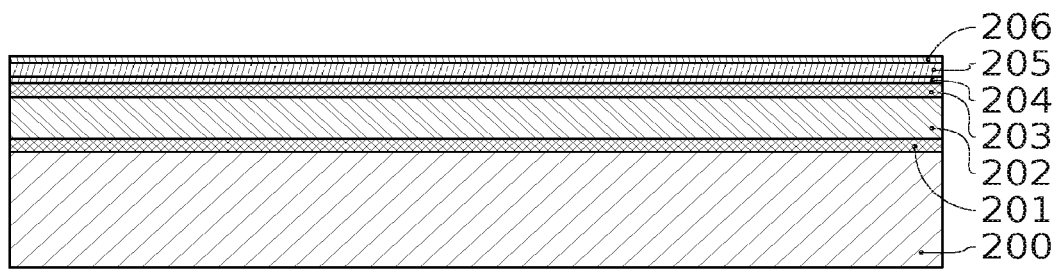

The first step of this method is illustrated in FIG. 9A. It consists in providing a substrate 200 over which extends a stack of layers which may successively comprise, starting from one face of the substrate 200:

- a first insulating layer 201, for example based on silicon oxide, which may be deposited by Plasma-Enhanced Chemical Vapour Deposition (or PECVD),
- a layer 202 intended to form the beam 305 of the electromechanical transducer 11, this layer 202 being for example based on amorphous silicon and may be deposited by Chemical Vapour Deposition (or CVD) at subatmospheric pressure (or LPCVD) or through the use of SOI-type (standing for Silicon On Insulator) structure,
- a second insulating layer 203, for example based on silicon oxide and which may be deposited by PECVD,
- a layer 204 intended to form a so-called lower electrode, for example based on platinum and which may be deposited by Physical Vapour Deposition (or PVD),
- a layer 205 made of a piezoelectric material, for example based on PZT, and which may be deposited through sol-gel process, and
- a layer 206 intended to form a so-called upper electrode, for example based on platinum and which may be deposited by PVD.

Figure 10A:
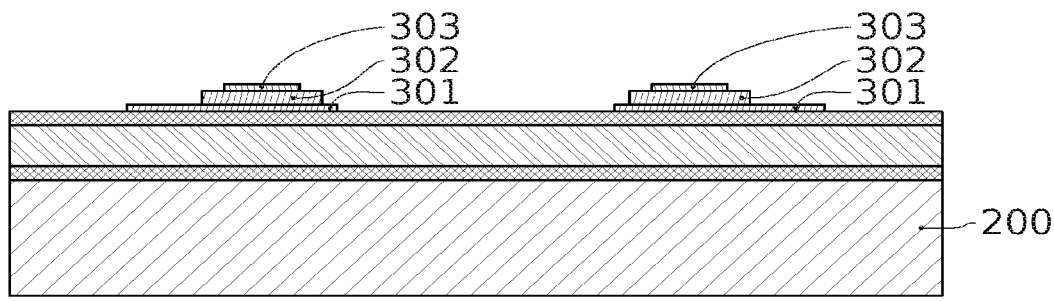

The second step of the method for manufacturing the electromechanical microsystem 1 as illustrated in FIG. 8A is illustrated in FIG. 10A. It comprises:

- etching of the layer 206 so as to form the upper electrode 301 of the electromechanical transducer 11,
- etching of the layer 205 so as to form the piezoelectric elements 302 of the electromechanical transducer 11, and
- etching of the layer 204 so as to form the lower electrode 303 of the electromechanical transducer 11.

Note that each of these etchings may be carried out by lithography, and preferably by plasma etching, or by a wet chemical process.

Figure 11A:
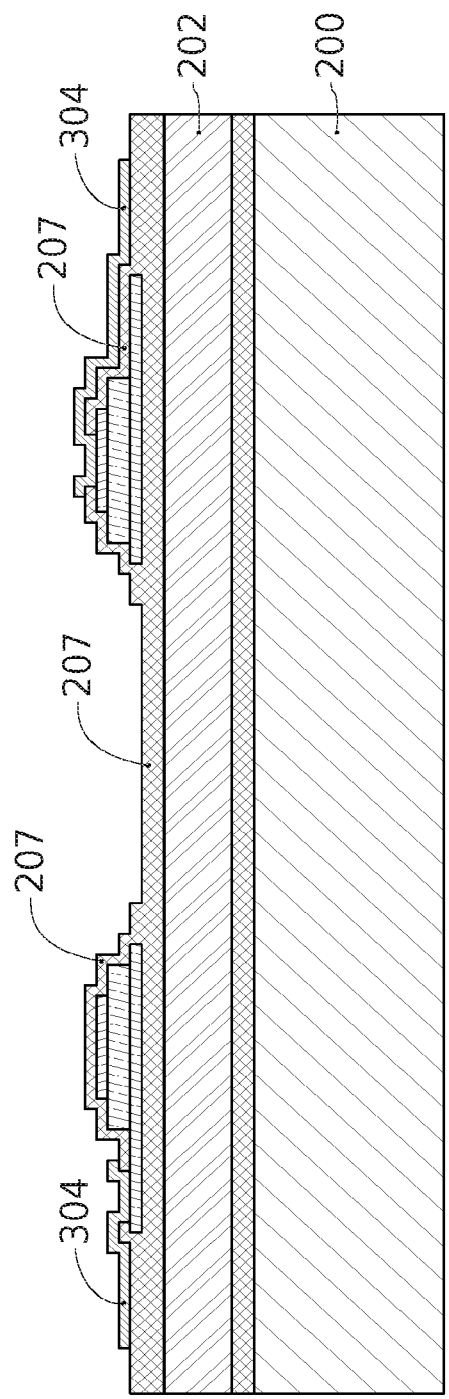

The third step of the method for manufacturing the electromechanical microsystem 1 as illustrated in FIG. 8A is illustrated in FIG. 11A. It comprises:

- the deposition of a passivation layer 207, for example based on silicon oxide and/or silicon nitride, may be deposited by PECVD,
- opening, through the passivation layer 207, of an area for resuming contact per electrode, this opening may be carried out for example by lithography, and preferably by plasma etching, or by a wet chemical process,
- the deposition of a layer intended to form an electric line 304 per electrode, the layer being for example based on gold and may be deposited by PVD, and
- etching of the previously deposited layer so as to form an electric line 304 per electrode, this etching being carried out for example by lithography, and preferably by plasma etching, or by a wet chemical process.

Figure 12A:
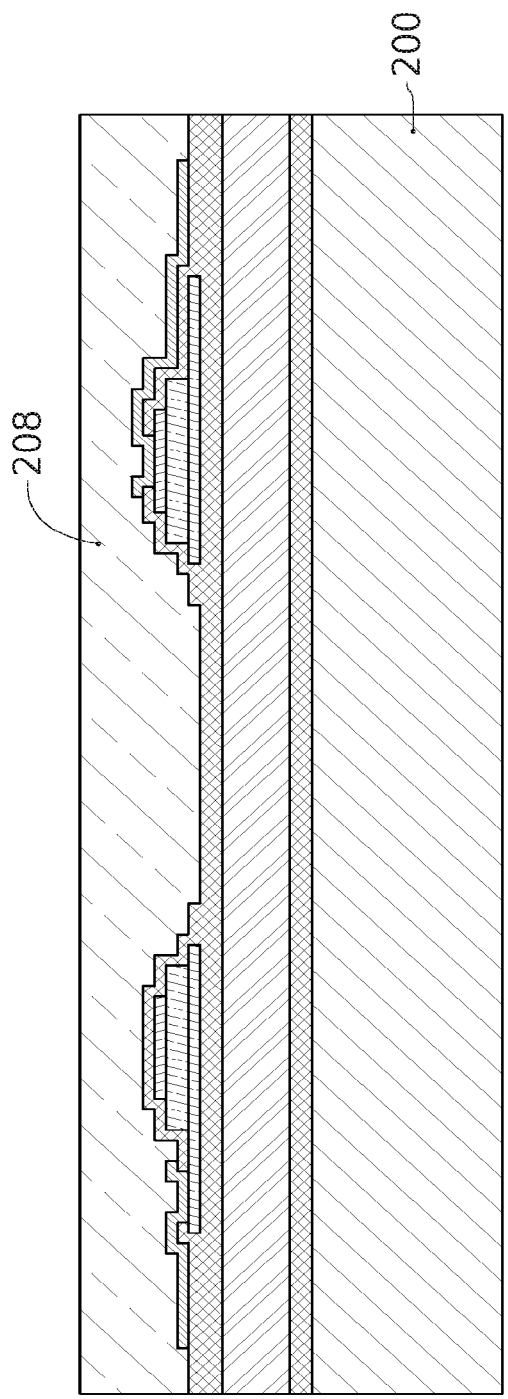

The fourth step of the method for manufacturing the electromechanical microsystem 1 as illustrated in FIG. 8A is illustrated in FIG. 12A. It comprises the deposition of a polymer-based layer 208 intended to form the deformable diaphragm 12. For example, this layer 208 is deposited by spin coating. For example, the polymer based on which the layer 208 is formed is based on PDMS.

Figure 13A:
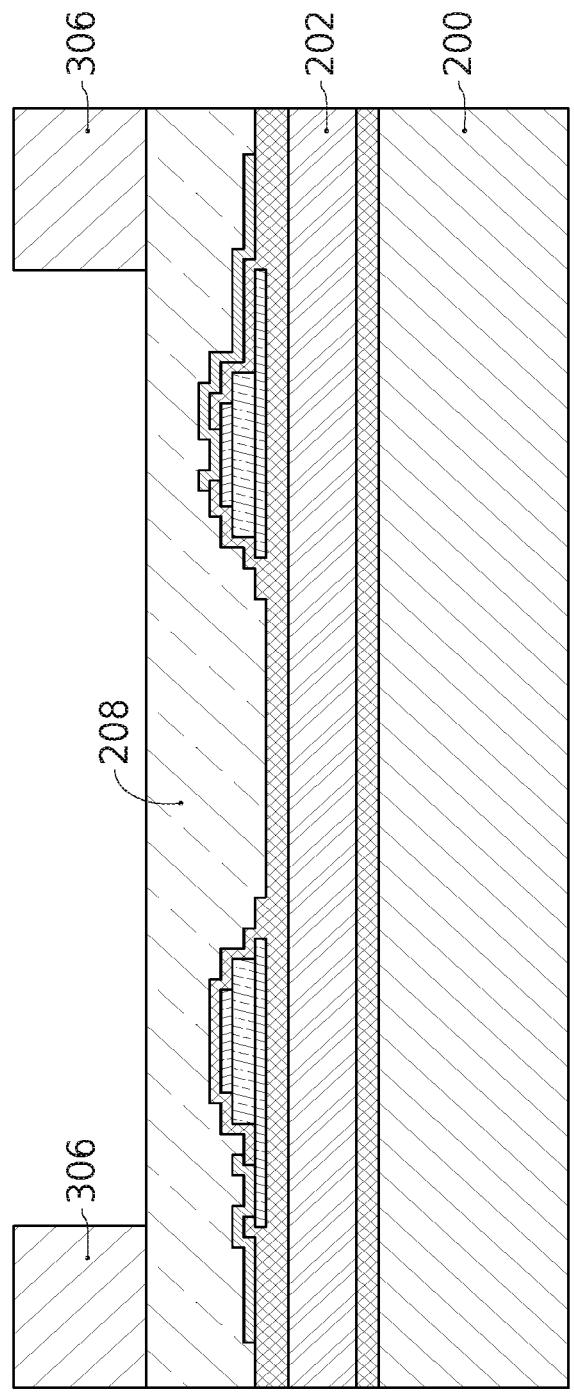

The fifth step of the method for manufacturing an electromechanical microsystem 1 as illustrated in FIG. 8A is illustrated in FIG. 13A. It comprises the formation of at least one spacer 306 intended to form at least one portion of said at least one lateral wall 133 of the cavity 13. The formation of the spacer(s) may comprise rolling of a photosensitive material based on which the spacer(s) is/are formed, insulation, and then the development of the photosensitive material. Said photosensitive material may be based on a polymer, and in particular based on Siloxane. Rolling of the photosensitive material may comprise rolling of a dry film of said material.

Figure 14A:
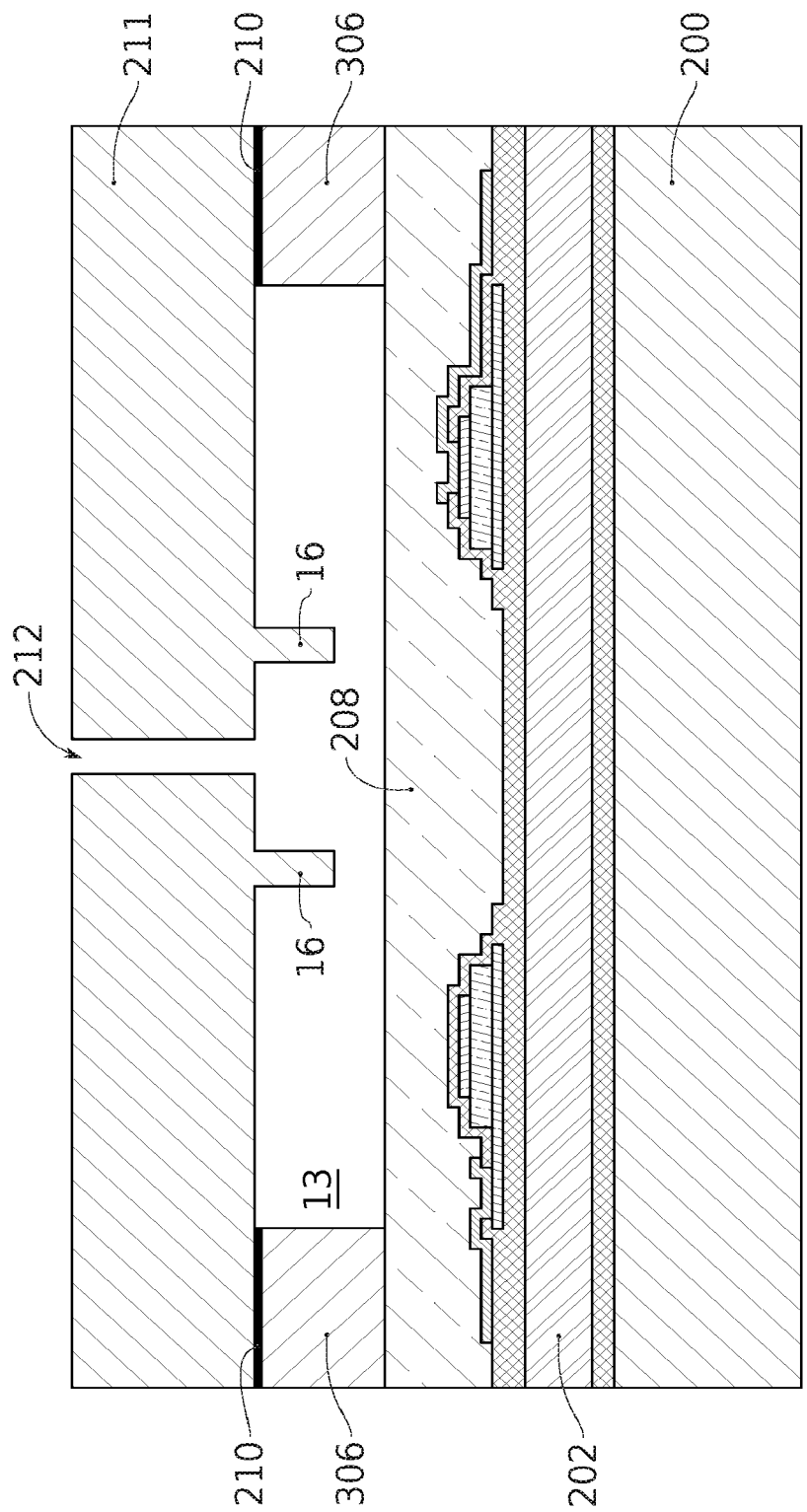

The sixth step of the method for manufacturing an electromechanical microsystem 1 as illustrated in FIG. 8A is illustrated in FIG. 14A. According to an optional embodiment, this step comprises the deposition of glue 210 at the top of each spacer 306, this deposition could be carried by screen-printing or by dispensing. It comprises fastening, for example by gluing, at the top of the spacer(s) (possibly through the glue 210), a second substrate 211 which could be structured so as to comprise at least one amongst a through vent 212 and a bottom stop 16 as described hereinabove. In an alternative embodiment, depending on the nature of the spacer, the latter could serve as glue. Upon completion of this sixth step, the cavity 13 is formed which is open by at least one through vent 212.

Figure 15A:
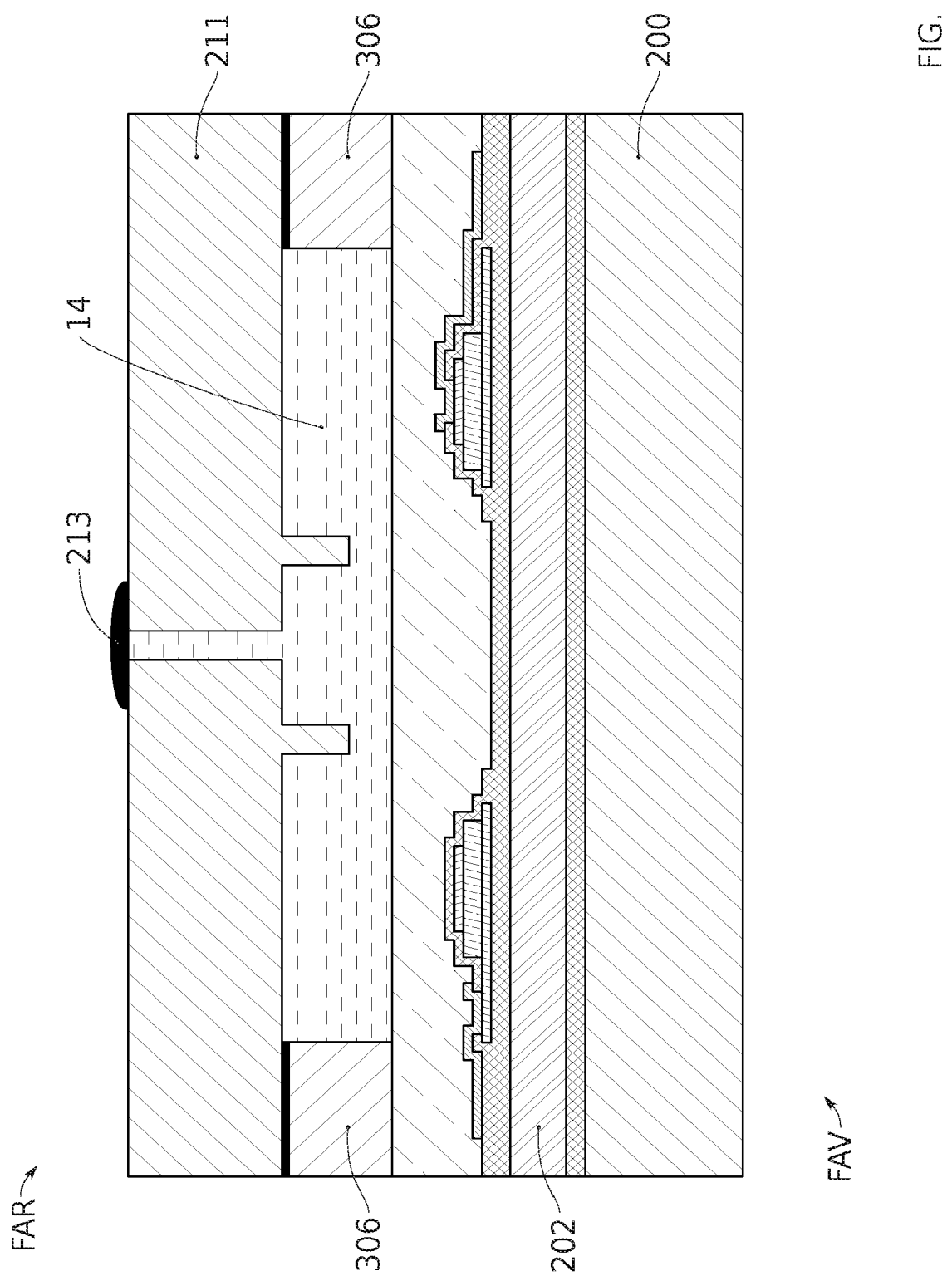

The seventh step of the method for manufacturing an electromechanical microsystem 1 as illustrated in FIG. 8A is illustrated in FIG. 15A. It comprises filling, preferably under vacuum, the cavity 13 with the deformable medium 14 as described hereinabove, for example by dispensing through the through vent 212. It also comprises the tight closure of the at least one through vent 212, for example by dispensing a sealing material 213 at the mouth of each through vent 212, the sealing material 213 being for example based on an epoxy glue.

An additional step allows obtaining the electromechanical microsystem 1 as illustrated in FIG. 8A. It comprises etching of the substrate 200. This etching may be carried out by lithography, and preferably by plasma etching, or by a wet chemical process. Afterwards, it comprises etching of the layer 202 and of the insulating layers 201, 203 so as to form at least one beam 305 of the electromechanical transducer 11, expose a portion of the deformable diaphragm 12 and form all or part of the pin 122 of the possible lateral stops 15.

Note that, following the above-described steps of manufacturing the electromechanical microsystem 1 as illustrated in FIG. 8A, the pin 122 is in the form of a stack extending directly from the deformable diaphragm 12 opposite to first cavity 13 while successively presenting the material of the insulating layer 201, the material forming the beam 305, the material of the insulating layer 203 and the material forming the substrate 200. It should be noticed that the pin 122 is not centred on the free area 121.

Also note that, following the above-described steps of manufacturing the electromechanical microsystem 1 as illustrated in FIG. 8A, each of the possible lateral stops 15 is in the form of a stack extending, directly or indirectly, from the deformable diaphragm 12 opposite to the cavity 13 while successively presenting the material of the insulating layer 201, the material forming the beam 305, the material of the insulating layer 203 and the material forming the substrate 200.

The method for manufacturing the electromechanical microsystem 1 as illustrated in FIG. 8B is described hereinbelow.

Figure 9B:
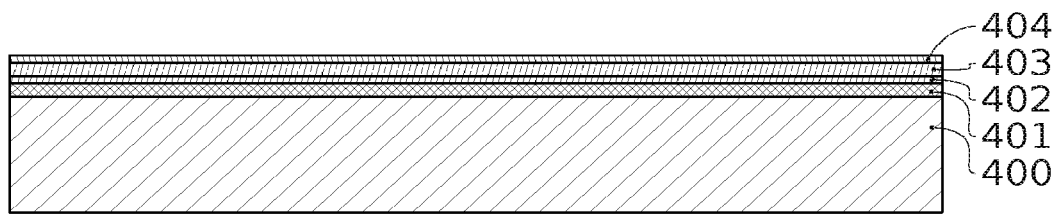

The first step of this method is illustrated in FIG. 9B. It consists in providing a substrate 400 over which extends a stack of layers which may successively comprise, starting from one face of the substrate 400:

a first insulating layer 401, for example based on silicon oxide, which may be deposited by PECVD-Enhanced Chemical Vapour Deposition, a layer 402 intended to form a so-called lower electrode, for example based on platinum and which may be deposited by PVD, a layer 403 made of a piezoelectric material, for example based on PZT, and which may be deposited through sol-gel process, and a layer 404 intended to form a so-called upper electrode, for example based on platinum and which may be deposited by PVD.

Figure 10B:
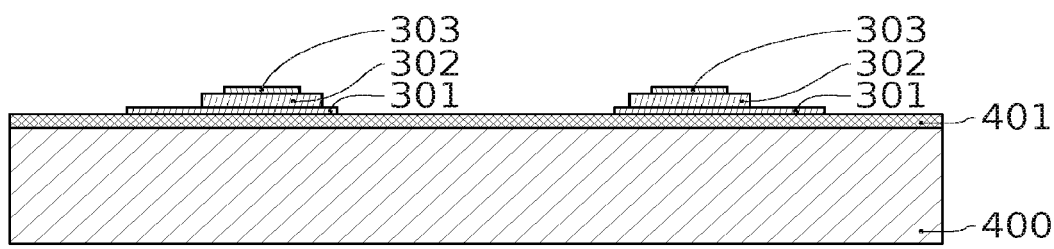

The second step of the method for manufacturing the electromechanical microsystem 1 as illustrated in FIG. 8B is illustrated in FIG. 10B. It comprises:

etching of the layer 404 so as to form the upper electrode 301 of the electromechanical transducer 11, etching of the layer 403 so as to form the piezoelectric elements 302 of the electromechanical transducer 11, and etching of the layer 402 so as to form the lower electrode 303 of the electromechanical transducer 11.

Note that each of these etchings may be carried out by lithography, and preferably by plasma etching, or by a wet chemical process.

Figure 11B:
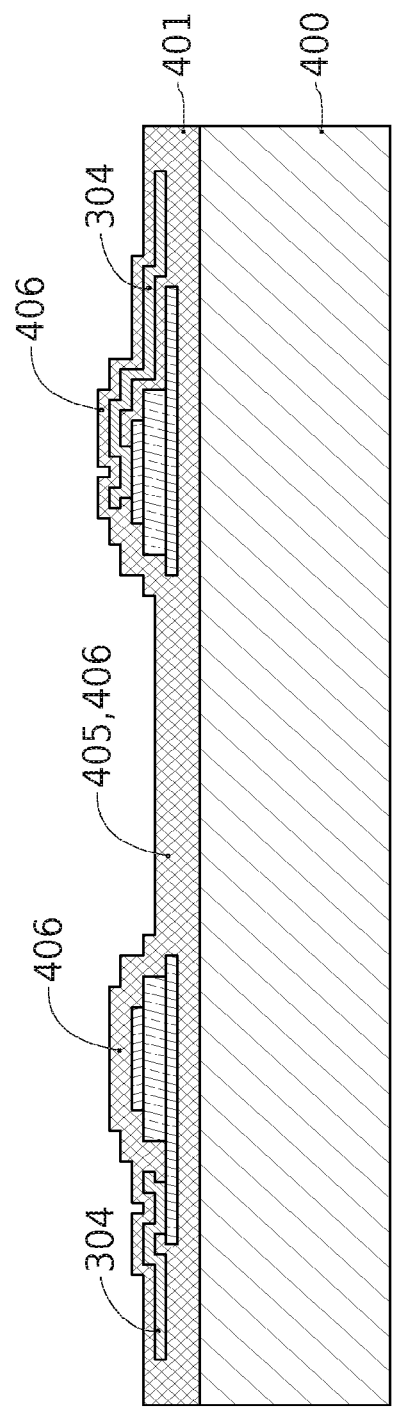

The third step of the method for manufacturing the electromechanical microsystem 1 as illustrated in FIG. 8B is illustrated in FIG. 11B. It comprises:

the deposition of a passivation layer 405, for example based on silicon oxide and/or silicon nitride, may be deposited by PECVD, opening, through the passivation layer 207, of an area for resuming contact per electrode, this opening may be carried out for example by lithography, and preferably by plasma etching, or by a wet chemical process, the deposition of a layer intended to form an electric line 304 per electrode, the layer being for example based on gold and may be deposited by PVD, and etching of the previously deposited layer so as to form an electric line 304 per electr ode, this etching being carried out for example by lithography, and preferably by plasma etching, or by a wet chemical process, then the deposition of a passivation layer 406, for example based on silicon oxide and/or silicon nitride, may be deposited by PECVD.

Figure 12B:
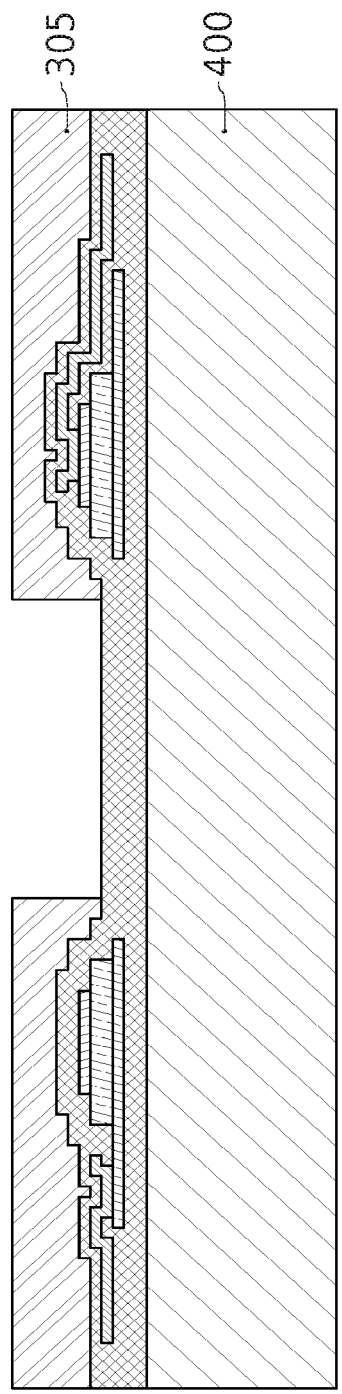

The fourth step of the method for manufacturing the electromechanical microsystem 1 as illustrated in FIG. 8B is illustrated in FIG. 12B. It comprises the deposition of a layer intended to form the beam 305 of the electromechanical transducer 11, this layer being for example based on amorphous silicon and may be deposited by PVD. Afterwards, it may comprise a step of planarising the layer deposited before. Afterwards, it comprises etching of the layer deposited before so as to form at least one beam 305 of the electromechanical transducer 11. This etching being carried out for example by lithography, and preferably by plasma etching, or by a wet chemical process.

Figure 13B:
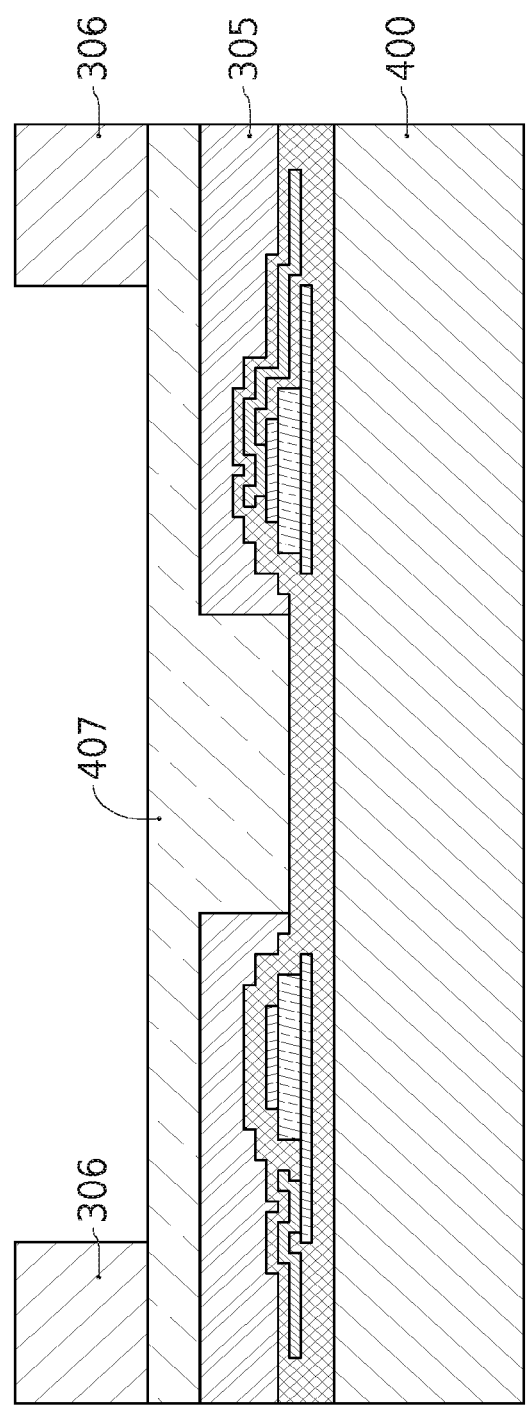

The fifth step of the method for manufacturing the electromechanical microsystem 1 as illustrated in FIG. 8B is illustrated in FIG. 13B. It comprises:

the deposition of a polymer-based layer 407 intended to form the deformable diaphragm 12. For example, this layer 407 is deposited by spin coating. For example, the polymer based on which the layer 407 is formed is based on PDMS, and the formation of at least one spacer 306 intended to form at least one portion of said at least one lateral wall 133 of the cavity 13.

The formation of the spacer(s) 306 may comprise rolling of a photosensitive material based on which the spacer(s) is/are formed, insulation, and then the development of the photosensitive material. Said photosensitive material may be based on a polymer, and in particular based on Siloxane. Rolling of the photosensitive material may comprise rolling of a dry film of said material.

Figure 14B:
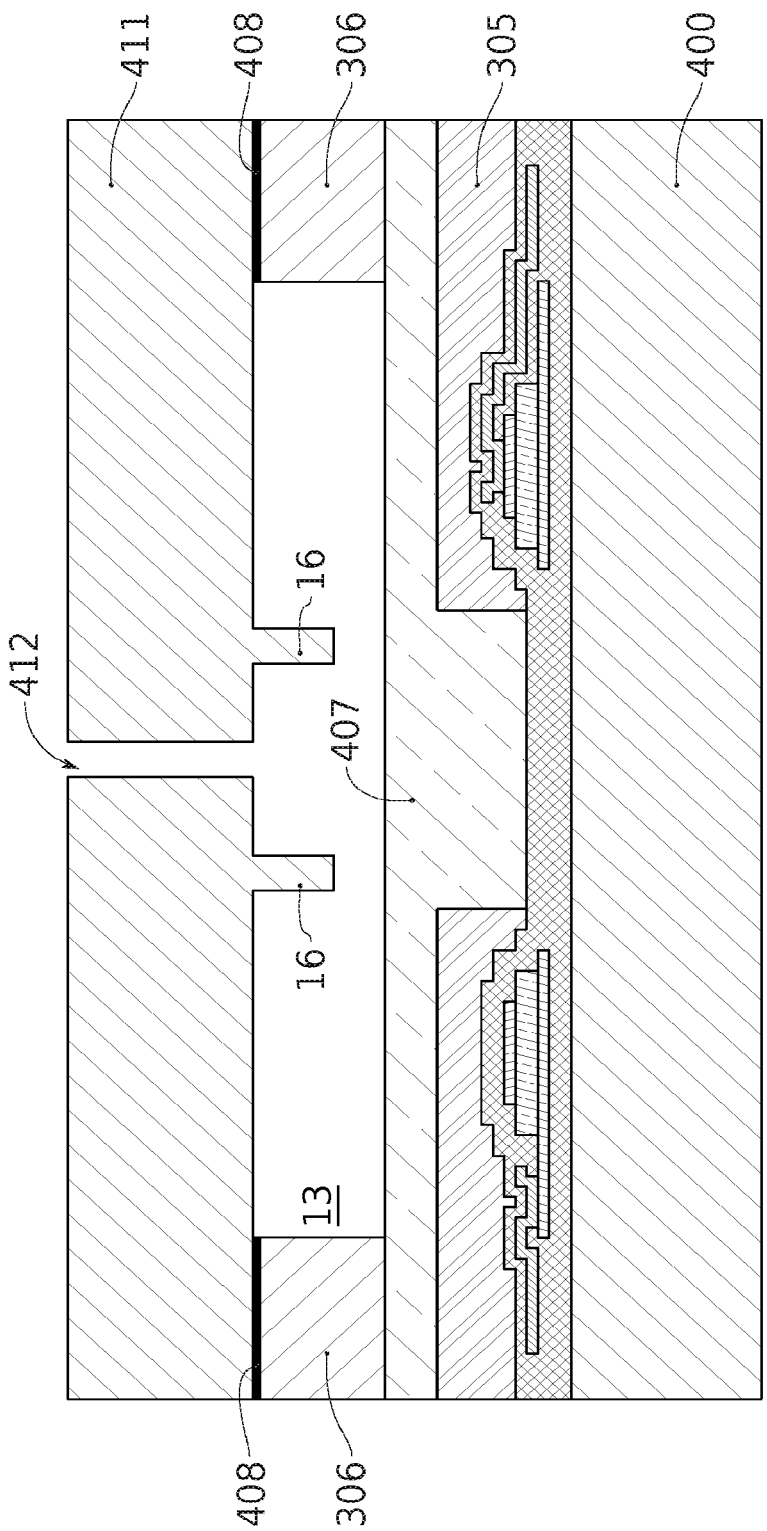

The sixth step of the method for manufacturing an electromechanical microsystem 1 as illustrated in FIG. 8B is illustrated in FIG. 14B. Where appropriate, it comprises the deposition of glue 408 at the top of each spacer 306. According to an optional example, this deposition may be carried by screen-printing or by dispensing. It comprises gluing, at the top of the spacer(s) 306 (possibly through the glue 408), a second substrate 411 which could be structured so as to comprise at least one amongst a through vent 412 and a bottom stop 16 as described hereinabove. In an alternative embodiment, depending on the nature of the spacer, the latter could serve as glue. Upon completion of this sixth step, the cavity 13 is formed which is open by at least one through vent 412.

Figure 15B:
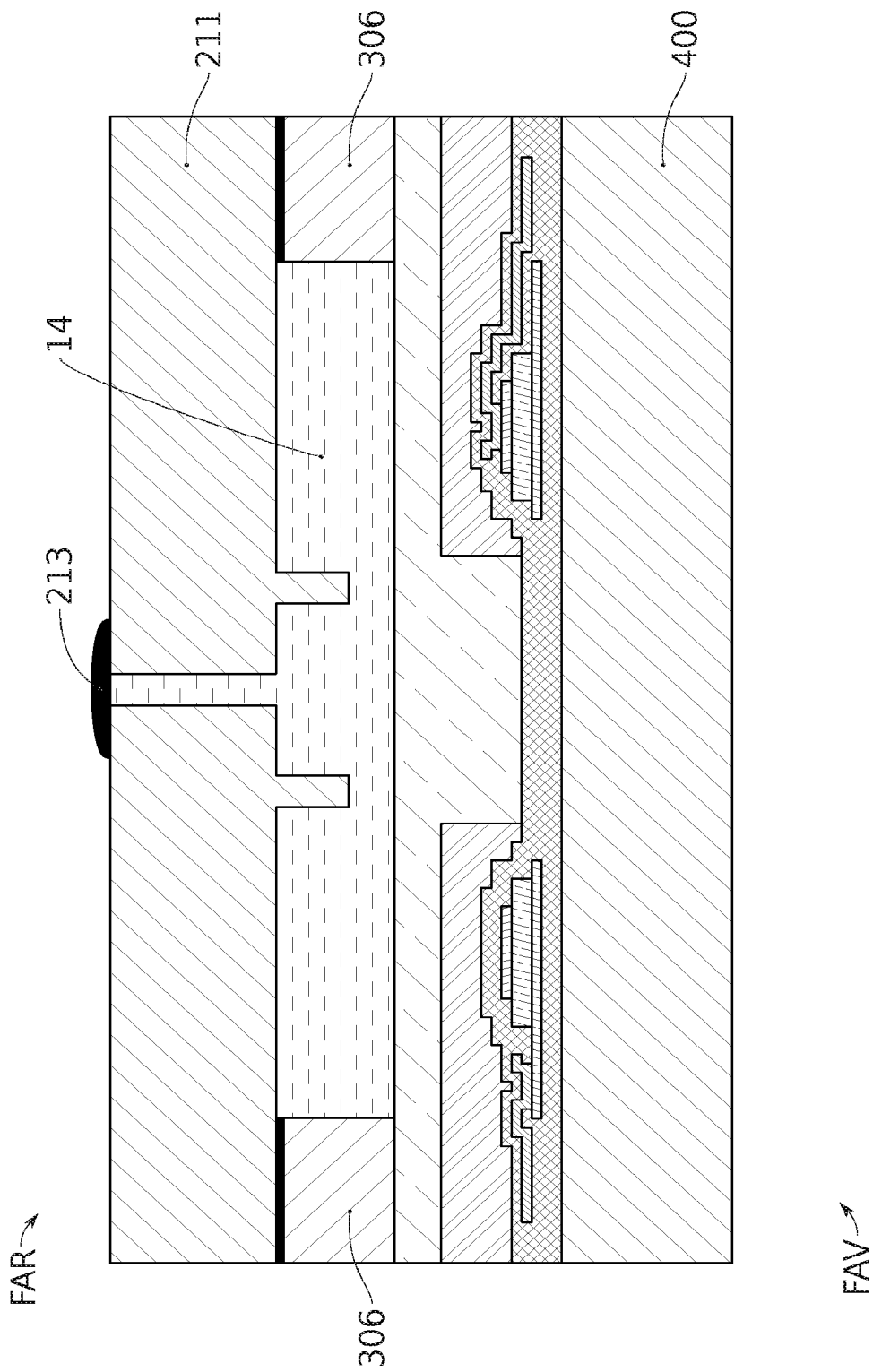

The seventh step of the method for manufacturing an electromechanical microsystem 1 as illustrated in FIG. 8B is illustrated in FIG. 15B. It comprises filling, preferably under vacuum, the cavity 13 with the deformable medium 14 as described hereinabove, for example by dispensing through the at least one through vent 212. It also comprises the tight closure of the at least one through vent 212, for example by dispensing a sealing material 213 at least at the mouth of each through vent 212, the sealing material 213 being for example based on an epoxy glue.

An additional step allows obtaining the electromechanical microsystem 1 as illustrated in FIG. 8B. It comprises etching of the substrate 200. This etching may be carried out by lithography, and preferably by plasma etching, or by a wet chemical process. Afterwards, it comprises etching of the insulating layer 401, so as to expose a portion of the deformable diaphragm 12 and form all or part of the pin 122 of the possible lateral stops 15.

Note that, following the above-described steps of manufacturing the electromechanical microsystem 1 as illustrated in FIG. 8B, the pin 122 is in the form of a stack extending directly from the deformable diaphragm 12 opposite to the cavity 13 while successively presenting the material of the insulating layer 401 and the material forming the substrate 200. It should be noticed that the pin 122 is not centred on the free area 121.

Also note that, following the above-described steps of manufacturing the electromechanical microsystem 1 as illustrated in FIG. 8B, each of the possible lateral stops 15 is in the form of a stack extending, directly or indirectly, from the beam 305 opposite to the cavity 13 while successively presenting the material of the insulating layer 401 and the material forming the substrate 200.

Figure 16:
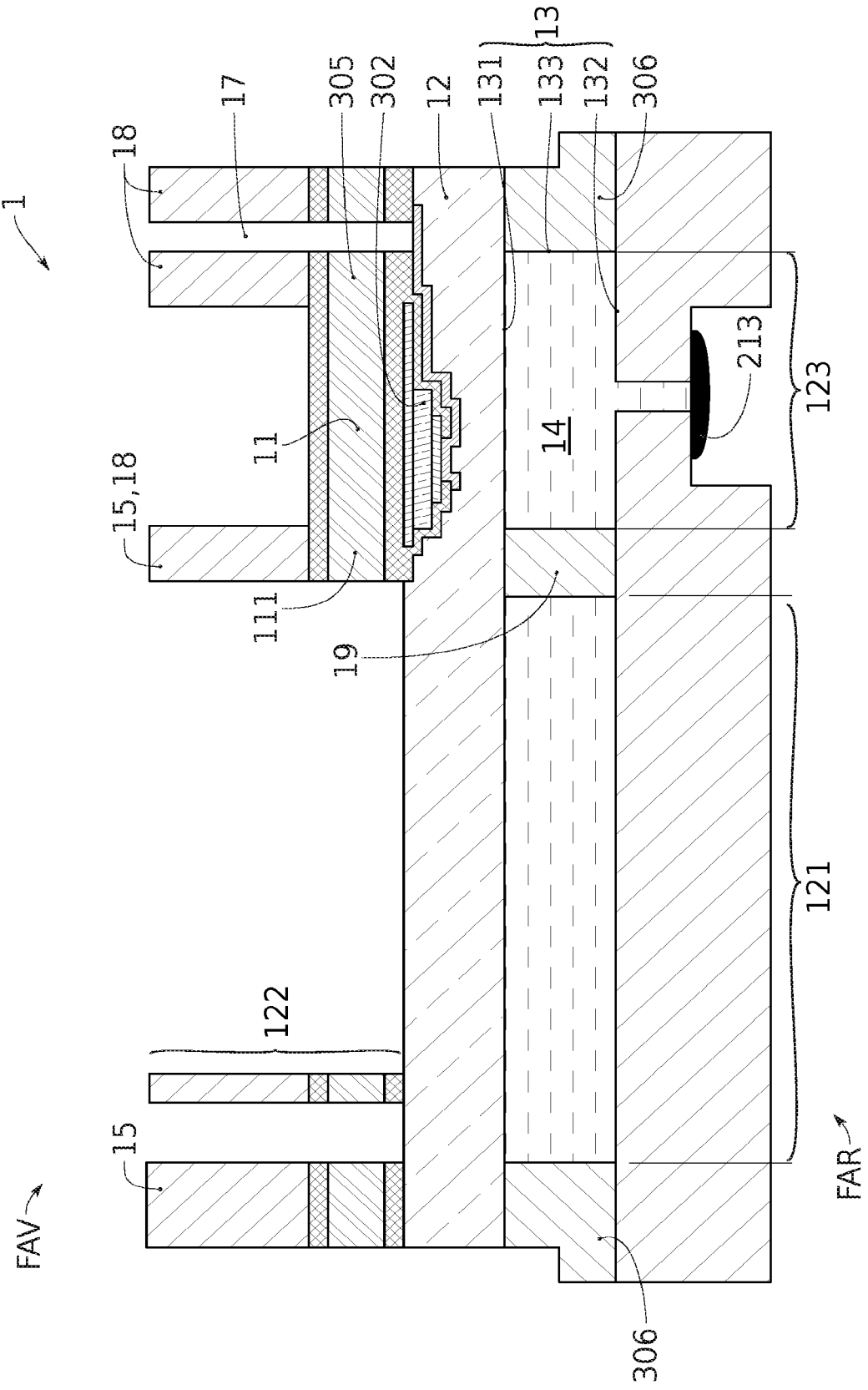
FIG. 16 schematically represents an electromechanical microsystem close to that illustrated in FIG. 1, but with a higher detail level.

Embodiment Illustrated in FIG. 16

FIG. 16 illustrates, in section, an embodiment corresponding to the embodiments illustrated in FIGS. 1 to 3A.

Thus, the electromechanical transducer 11 does not surround the free area 121 of the diaphragm 12. This embodiment allows having more freedom to adapt the dimension, the shape and the number of the free areas 121, without the electromechanical transducer 11 imposing any constraint on these parameters. For example, for the same dimension of the electromechanical transducer 11, this embodiment allows having a smaller extent of the free area 121 and therefore a larger deformation of the latter. The inclination that could be imposed to the pin 122 is then increased. Another benefit is to enable movements according to the axis in two opposite directions, i.e., upwards and downwards.

In this figure, all reference numerals correspond to the reference numerals of FIGS. 8A to 15B.

In FIG. 16, a strut 19 is represented. It may be in the form of a pillar or a low wall. This strut 19 allows supporting the diaphragm 12. The deformable medium 14 surrounds this strut 19. This strut 19 serves as a pillar inside the cavity 13. Where appropriate, the strut 19 allows, for example together with the portion of the cowl 18 over it, stiffening a contour of the electromechanical transducer 11, so that its deformation is converted, as much as possible, into a deformation of the diaphragm 12. It is possible to provide for several struts 19.

In FIG. 16, the electromechanical transducer 11 is configured so as to bend downwards when it is loaded, as this is the case in FIG. 9A. By replicating the structure of the electromechanical microsystem illustrated in this FIG. 16, it is perfectly possible to modify this electromechanical transducer 11 so that they bend upwards when it is loaded, as this is the case in FIG. 9B.

To manufacture the electromechanical microsystem 1 illustrated in FIG. 16 or else its variant with a bent at the bottom of the electromechanical transducer 11, it is possible to replicate and adapt without any difficulty the steps of the making processes described in detail with reference to FIGS. 9A to 15A and 9B to 15B.

Other Embodiments

Using the principles, the features and the technical effects mentioned with reference to the above-described embodiments, many variants may be considered. Some of its variants re briefly disclosed hereinbelow. All features and all technical effects mentioned in the following examples and in the above-described examples may be combined.

Figure 17A:
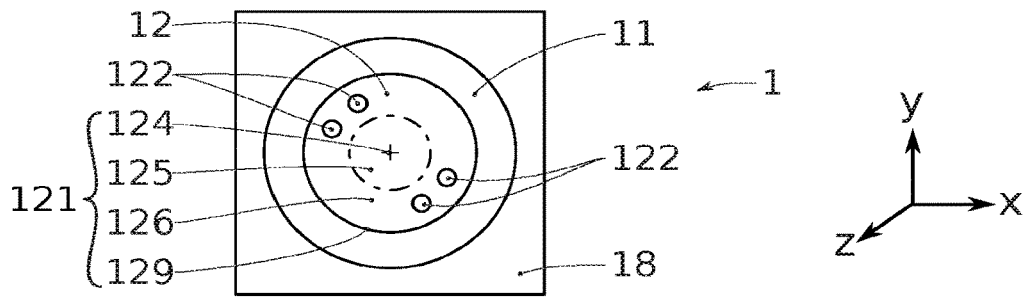
FIGS. 17A to 17D schematically represent variants of the opto-electro-mechanical microsystem according to the invention.

Relative Arrangement of the Electromechanical Transducer 11 and of the Free Area 121 of the Diaphragm 12:

FIG. 17A illustrates an embodiment wherein the electromechanical transducer completely surrounds the free area 121 of the diaphragm 12. This is also the case in the embodiments described in FIGS. 8A to 15B.

FIGS. 1 to 6E and 16 illustrate embodiments wherein the free area 121 is remote from the electromechanical transducer 11. This is also the case in FIGS. 17B and 17C. A fixed portion separates the free area 121 and the electromechanical transducer 11. This fixed portion may be formed at least partially by the cowl 18.

Figure 17B:
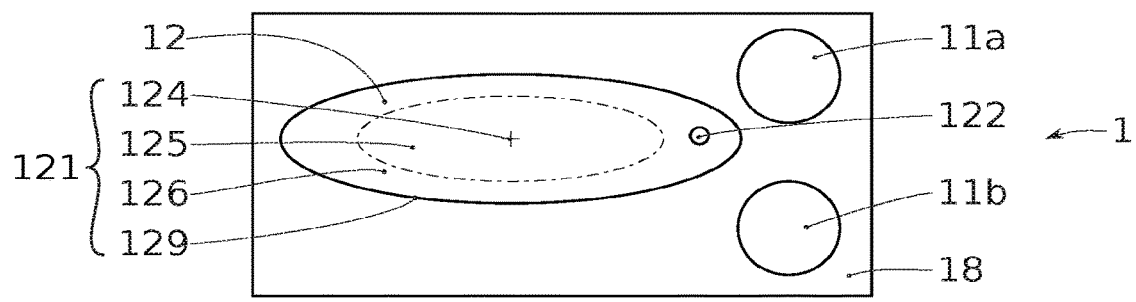
Figure 17C:
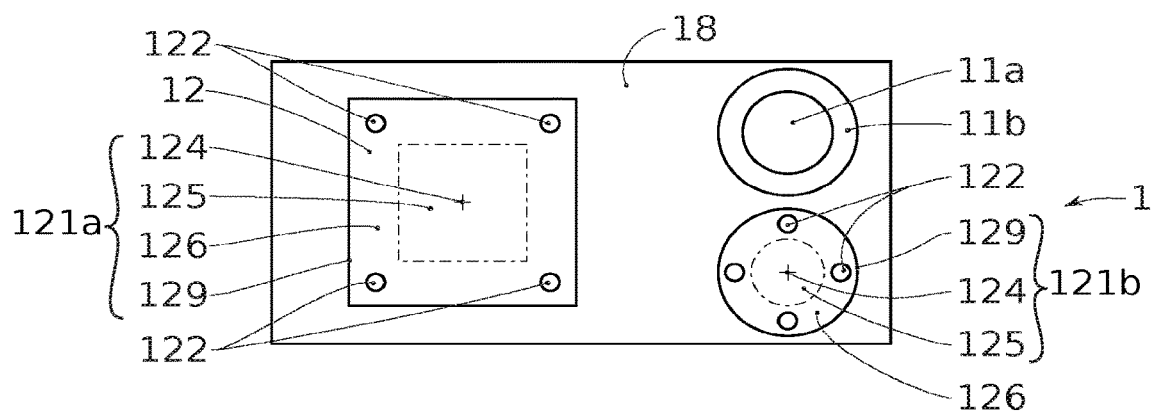
Figure 17D:
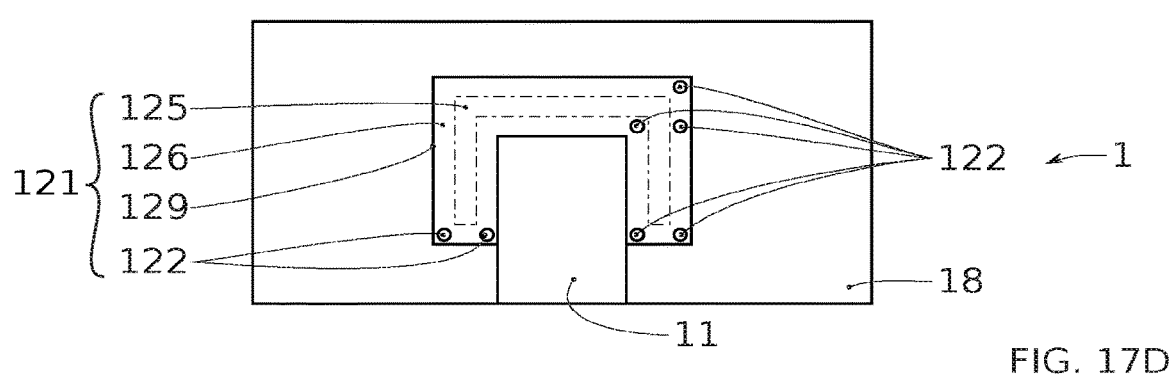

In FIG. 17D, the electromechanical transducer 11 is partially surrounded by the free area 121 of the diaphragm 12. A portion of the electromechanical transducer 11 is secured to a case of the electromechanical system 1, for example to its cowl 18. Another portion of the electromechanical transducer is surrounded by the free area 121 of the diaphragm 12. In this example, the free area 121 has a "U"-like general shape around the electromechanical transducer 11. Its central portion 125 then also has a "U"-like general shape. The outer perimeter 129 and the peripheral portion 126 surround the central portion 125. Hence, pins 122 positioned on either side of the central portion 125 could be brought into contact with each other when the free area 121 is deformed. The pins 122 then define a gripping line which extends along the central portion 125. In this example, this gripping also forms a "U". For example, this allows adapting the gripping area to specific shapes of objects to be grasped, captured or held.

Shape of the Free Area 121 and of the Electromechanical Transducer 11

The shapes of the free area 121 of the diaphragm 12 may be adapted with a great freedom according to the pursued objectives. For example, these objectives concern the amplitude of the inclination of the pins 122 or the shape that should be conferred on a gripping area ensured by the pins 122.

In FIG. 17A, the free area 121 has a disk-like shape. Its central portion 125, its peripheral portion 126 and its outer perimeter 129 then also have a disk-like or circular shape.

In FIG. 17B, the free area 121 has an oblong or ellipsoidal shape. Its central portion 125, its peripheral portion 126 and its outer perimeter 129 then also have an to oblong or ellipsoidal shape.

In FIG. 17C, the free area 121 has a polygonal shape, herein a square. Its central portion 125, its peripheral portion 126 and its outer perimeter 129 then also have a polygonal shape.

In FIG. 17D, the free area 121 forms an open contour. In this non-limiting example, this open contour forms a "U"-like shape.

Like the shape of the free area 121, the shape of the electromechanical transducer 11 may be adapted as desired.

Number and Relative Arrangement of the Electromechanical Transducers

In the embodiments illustrated in FIGS. 1 to 16, one single electromechanical transducer has been represented, for clarity.

Nevertheless, for each of these embodiments, it is possible to provide for several electromechanical transducers 11 for the same electromechanical microsystem 1.

FIGS. 17B and 17C illustrate embodiments comprising several electromechanical transducers 11a, 11b.

As illustrated in this FIG. 17B, the electromechanical transducers 11a, 11b may be separated from each other, for example by a cowl portion 18. Their movable portions are not then in contact.

As illustrated in this FIG. 17C, the electromechanical transducers 11a, 11b may be juxtaposed. Nevertheless, they are not completely contiguous. Indeed, the piezoelectric materials of the two electromechanical transducers 11a, 11b should be separated in order to be able to be individually polarised.

According to one example, the piezoelectric material of a first electromechanical transducer 11b surrounds, at least partially, and possibly completely, the piezoelectric material of one or several other electromechanical transducer(s) 11a. The movable portions of these electromechanical transducers 11a, 11b are continuous.

Of course, the number of electromechanical transducers 11 may be greater than two.

The electromechanical transducers may be loaded simultaneously or successively. The amplitude of displacement of the pin 122 induced by each electromechanical transducer 11 may be identical or different.

The presence of several electromechanical transducers 11 in the same electromechanical microsystem 1 allows for various operating modes.

According to a first embodiment, the electromechanical transducers 11a, 11b are configured so that, under load, their movable portions induce deformations of the free area 121 causing an inclination of the pin(s) 122 in the same direction. The overall inclination of the pin(s) then results from a cumulated displacement of the movable portions of these electromechanical transducers 11a, 11b. This could allow limiting the addressing voltage.

Moreover, in the case where the electromechanical transducers 11 could be activated independently from each other or successively, the electromechanical microsystem then has a step-by-step operation. This allows controlling the inclination of the pin(s) with an even greater accuracy.

According to a second embodiment, which could be combined with the step-by-step embodiment, at least some of the electromechanical transducers 11a, 11b are configured so that, under load, they induce an inclination of the pin(s) 122 in two opposite directions. Hence, these two electromechanical transducers 11a, 11b are antagonist. Thus, at least one of these electromechanical transducers allows inclining the pin 122 according to a first direction and at least another one of these electromechanical transducers 11a, 11b allows inclining the pin 122 according to a second direction opposite to the first direction. This allows increasing even more the amplitude of the possible inclination of the pin 122.

Number of Free Areas 121

As illustrated in FIG. 17C, it is possible to provide for several free areas 121a, 121b for the same electromechanical microsystem 1. For example, this may allow adapting the arrangement of the pins 122 to the objects to be displaced, grasped or captured. Moreover, the surface of each movable portion or movable portions of the transducers illustrated in FIG. 17C may be at least 5 times, and possibly 10 times, and possibly 20 times, larger than the surface of the free areas 121a, 121b of the deformable diaphragm 12.

Opto-electro-mechanical System 3

Figure 18A:
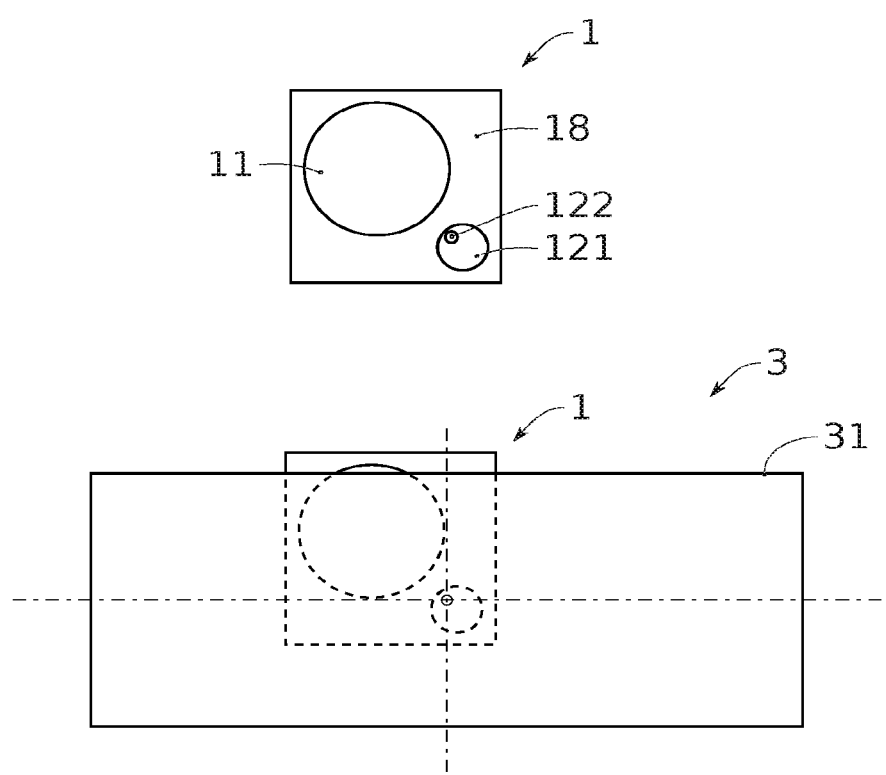
FIG. 18A schematically represents an example of an electromechanical microsystem comprising an electromechanical microsystem.

Another aspect of the invention relates to an opto-electro-mechanical system 3. A non-limiting example of such a system is illustrated in FIG. 18A. The opto-electro-mechanical microsystem 3 illustrated in this figure comprises at least one electromechanical microsystem 1 as described hereinabove and at least one optical microsystem 31. Preferably, the electromechanical microsystem 1 is mounted on a support of the opto-electro-mechanical microsystem 3.

The optical microsystem 31 may comprise a silicon-based micro-mirror. Preferably, the pin 122 is not disposed at the centre of the mirror. This allows increasing even more the amplitude of the inclination of the mirror.

The optical microsystem 31 may be mounted directly over the at least one electromechanical microsystem 1 or be mounted through a frame. It may have dimensions substantially equal to 2 mm×5 mm and/or, at most, a thickness of about 700 µm.

In the case where the opto-electro-mechanical system 3 comprises at least two electromechanical microsystems 1, each electromechanical microsystem 1 comprising one single pin 122, the optical microsystem 31 may be fixed, directly or indirectly, at the upper ends of the pins. In this manner, by driving all pins in the same displacement, the optical microsystem 31 is displaced in a circular translational movement.

Thus, an opto-electro-mechanical microsystem 3 allowing for a broad capability of adaptation of its optical orientation is obtained.

In light of the previous description, it clearly appears that the invention allows obtaining an inclination of one or several pin(s) 122 with an angular stroke whose amplitude is large and perfectly controlled. This allows obtaining actuators, gripping devices, and possibly sensors, with a large stroke and with a great accuracy.

The invention is not limited to the previously-described embodiments and extends to all embodiments covered by the claims.

In particular, applications other than those described hereinabove may be considered. For example, the electromechanical microsystem 1 may be arranged in a system for self-assembling microelectronic components.

Moreover, in the case where the electromechanical microsystem 1 ensures a gripping function, it is possible to provide for a free end 122b of the pin 12 allowing capturing an object of its own. For this purpose, it is possible to provide for this free end 122b having a suitable shape or material. For example, the free end 122b may form a curved finger or hook for grasping an object. It may also have any other shape complementary with the object to grasp the latter. Furthermore, the material of the fee end 122b of the pin 122 may participate in ensuring capture of an object on its own. For example, it is possible to provide for coating at least one portion of the pin 122 with an adhesive material or at least with a material that adheres with the material of the object to be captured. It is also possible to provide for the pin 122 comprising a magnetic or ferromagnetic material allowing capturing an object by means of a magnetic force.

The invention claimed is:

1. An electromechanical microsystem comprising:
   at least one electromechanical transducer comprising a portion movable between a balance position, off-load, and an out-of-balance position, under load,
   at least one deformable diaphragm,
   a first deformable cavity, delimited by walls, at least one portion of the deformable diaphragm forming at least one portion of a first wall selected amongst said walls of the cavity, the cavity being configured to hermetically contain a deformable medium capable of keeping a substantially constant volume under the action of a change of an external pressure exerted on the deformable medium through one of the walls of the cavity,
   wherein the movable portion of the electromechanical transducer is configured so that its movement depends on said change in the external pressure, or conversely its movement induces a change in the external pressure, and wherein said at least one portion of the deformable diaphragm has at least one free area freely deformable, elastically, as a function of said change in the external pressure, the free area having an outer perimeter and a peripheral portion which extends from the outer perimeter and up to a central portion of the free area,
   the electromechanical microsystem comprising at least one pin, configured to bear on the peripheral portion of the free area so that a deformation of the free area of the diaphragm causes an inclination of the pin.

2. The electromechanical microsystem according to claim 1, wherein in the absence of deformation, the free area of the diaphragm extends primarily in an off-deformation plane, and the perpendicular to the tangent at a given point of the free area extends according to a direction T1 perpendicular to the off-deformation plane, and when the diaphragm is deformed, the perpendicular to the tangent at a given point of the peripheral portion of the free area extends according to a direction Ti inclined by an angle αi with respect to the direction T1, the angle αi increasing progressively when getting away from the central portion and approaching the outer perimeter of the free area.

3. The electromechanical microsystem according to claim 2, wherein the pin extends primarily according to a longitudinal direction and wherein when the diaphragm is not deformed, the longitudinal direction of the pin is substantially perpendicular to a plane wherein an outer face of the diaphragm primarily extends when the diaphragm is not deformed, the electromechanical microsystem being configured so that a deformation of the free area of the diaphragm causes an inclination of the first end in the direction of the central portion of the free area.

4. The electromechanical microsystem according to claim 1, wherein the central portion comprises a centre which corresponds to the barycentre of the free area.

5. The electromechanical microsystem according to claim 4, wherein the free area forms a disk, an ellipse or a polygon.

6. The electromechanical microsystem according to claim 1, wherein the free area is delimited by an outer perimeter, the pin being located at a minimum distance D122 from the outer perimeter such that D122 is smaller than k times a distance D124, D122 being measured between the pin and the point of the outer perimeter the closest to the pin, and the distance D124 being measured between this same point and the centre of the free area, k being less than 0.7.

7. The electromechanical microsystem according to claim 1, comprising a plurality of pins, each bearing on the peripheral portion of the free area so that a deformation of the free area of the diaphragm causes an inclination of the pins.

8. The electromechanical microsystem according to claim 7, wherein the pins have a free end, opposite to the end by which they bear on the peripheral portion of the free area, the pins being shaped so that a deformation of the free area of the diaphragm selectively causes an approach or a separation of the free ends of the pins.

9. The electromechanical microsystem according to claim 1, wherein the pins are shaped so that a deformation of the free area of the diaphragm selectively causes a contact or a separation of the free ends of the pins.

10. The electromechanical microsystem according to claim 1, wherein the pins are distributed over the peripheral portion so that the approach of their free ends allows forming a cage above the free area.

11. The electromechanical microsystem according to claim 1, wherein the pin(s) is/are configured so as to cooperate with an object forming an external member so that the movement of the movable portion of the electromechanical transducer depends on a displacement of the pin(s) driven by the external member or conversely so that the movement of the movable portion of the electromechanical transducer induces a displacement, in particular an inclination, of the external member through the pin(s).

12. The electromechanical microsystem according to claim 11, wherein the pin(s) is/are configured so as to be able to be secured to the external member by gluing or magnetically.

13. The electromechanical microsystem according to claim 11, further comprising at least one lateral stop, supported by said first wall of the cavity, configured to guide the movement of the external member.

14. The electromechanical microsystem according to claim 1, wherein the pin(s) is/are fastened on said free area, preferably by direct contact with said free area.

15. The electromechanical microsystem according to claim 1, comprising a plurality of electromechanical transducers.

16. The electromechanical microsystem according to claim 15, wherein at least some of the electromechanical transducers of said plurality are configured so that, under load, their movable portions induce deformations of the free area of the diaphragm causing an inclination of the at least one pin in the same direction.

17. The electromechanical microsystem according to claim 1, wherein at least some of the electromechanical transducers of said plurality are configured so that, under load, their movable portions induce deformations of the free area of the diaphragm causing an inclination of the at least one pin in two opposite directions.

18. The electromechanical microsystem according to claim 1, comprising several free areas, separated from each other by a non-zero distance.

19. The electromechanical microsystem according to claim 1, wherein the deformable diaphragm is configured so that its free area could be deformed with an amplitude of at least 50 μm, and possibly about 100 μm.

20. The electromechanical microsystem according to claim 19, wherein the electromechanical transducers completely surrounds the free area of the deformable diaphragm, the electromechanical transducers having an annular shape whose circular centre defines the extent of the free area of the deformable diaphragm.

21. The electromechanical microsystem according to claim 1, further comprising a bottom stop supported by the wall of the cavity opposite to the free area of the deformable diaphragm, the bottom stop extending in the cavity towards the free area and having a shape and dimensions configured so as to limit the deformation of the free area of the deformable diaphragm or limit a contact surface between the diaphragm and the wall of the cavity opposite to the free area of the deformable diaphragm.

22. An opto-electro-mechanical system comprising at least one electromechanical microsystem according to claim 1, and at least one optical microsystem, the optical microsystem comprising at least one mirror based on silicon, the opto-electro-mechanical system being configured so that the movement of the movable portion of the electromechanical transducer causes a displacement of the at least one mirror.

* * * * *